(12) United States Patent
Chen et al.

(10) Patent No.: US 11,423,204 B1
(45) Date of Patent: Aug. 23, 2022

(54) SYSTEM AND METHOD FOR BACK SIDE SIGNAL ROUTING

(71) Applicant: Taiwan Semiconductor Manufacturing Company Limited, Hsinchu (TW)

(72) Inventors: Sheng-Hsiung Chen, Zhubei (TW); Jerry Chang Jui Kao, Taipei (TW); Kuo-Nan Yang, Hsinchu (TW); Jack Liu, Taipei (TW)

(73) Assignee: TAIWAN SEMICONDUCTOR MANUFACTURING COMPANY LIMITED, Hsinchu (TW)

( * ) Notice: Subject to any disclaimer, the term of this patent is extended or adjusted under 35 U.S.C. 154(b) by 0 days.

(21) Appl. No.: 17/230,393

(22) Filed: Apr. 14, 2021

(51) Int. Cl.
*G06F 30/00* (2020.01)
*G06F 30/392* (2020.01)
*G06F 30/394* (2020.01)
*G06F 30/396* (2020.01)

(52) U.S. Cl.
CPC .......... *G06F 30/392* (2020.01); *G06F 30/394* (2020.01); *G06F 30/396* (2020.01)

(58) Field of Classification Search
CPC ..... G06F 30/392; G06F 30/394; G06F 30/396
See application file for complete search history.

(56) References Cited

U.S. PATENT DOCUMENTS

| 10,692,826 | B2 * | 6/2020 | Wei | H01L 24/05 |
| 11,139,283 | B2 * | 10/2021 | Delacruz | H01L 25/0657 |
| 2019/0096830 | A1 * | 3/2019 | Wei | H01L 27/14685 |
| 2021/0358850 | A1 * | 11/2021 | Chen | H01L 23/5385 |

FOREIGN PATENT DOCUMENTS

| CN | 100414402 C | * | 8/2008 | ......... G02F 1/13452 |
| TW | 200414455 A | * | 8/2004 | .......... H01L 23/3114 |
| TW | 202101764 A | * | 1/2021 | ....... H01L 21/28264 |
| TW | 202114192 A | * | 4/2021 | ....... H01L 27/14605 |
| WO | WO-2021028750 A1 | * | 2/2021 | |

* cited by examiner

*Primary Examiner* — Naum Levin
(74) *Attorney, Agent, or Firm* — Foley & Lardner LLP

(57) ABSTRACT

A system includes a substrate having a first side and a second side opposite the first side, a cell on the substrate having a first pin on either the first side or the second side, and a second pin on the second side, a first signal connected to the first pin, and a second signal connected to the second pin.

20 Claims, 13 Drawing Sheets

Example: Top Design

SYSTEM AND METHOD FOR BACK SIDE SIGNAL ROUTING

BACKGROUND

The present disclosure relates generally to signal routing, and particularly to signal routing on a back side of a semiconductor substrate.

Integrated circuits are widely used in a variety of applications. Designing an integrated circuit is a multi-step process. Specifically, the design of an integrated circuit begins with a description of the functionality desired from the integrated circuit. From the functional description, a transistor level circuit is designed and a netlist that defines the connectivity of the various transistors in the circuit is developed. The netlist may be simulated and tested to verify that the circuit implements the desired functionality, and to predict operating parameters. The netlist is then used to create a standard cell layout of the circuit. The standard cell layout includes a placement of standard elements or standard cells from a standard cell library, and signal routing to show how those cells are interconnected. However, present-day standard cell layout techniques have limitations in the way the signals are routed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
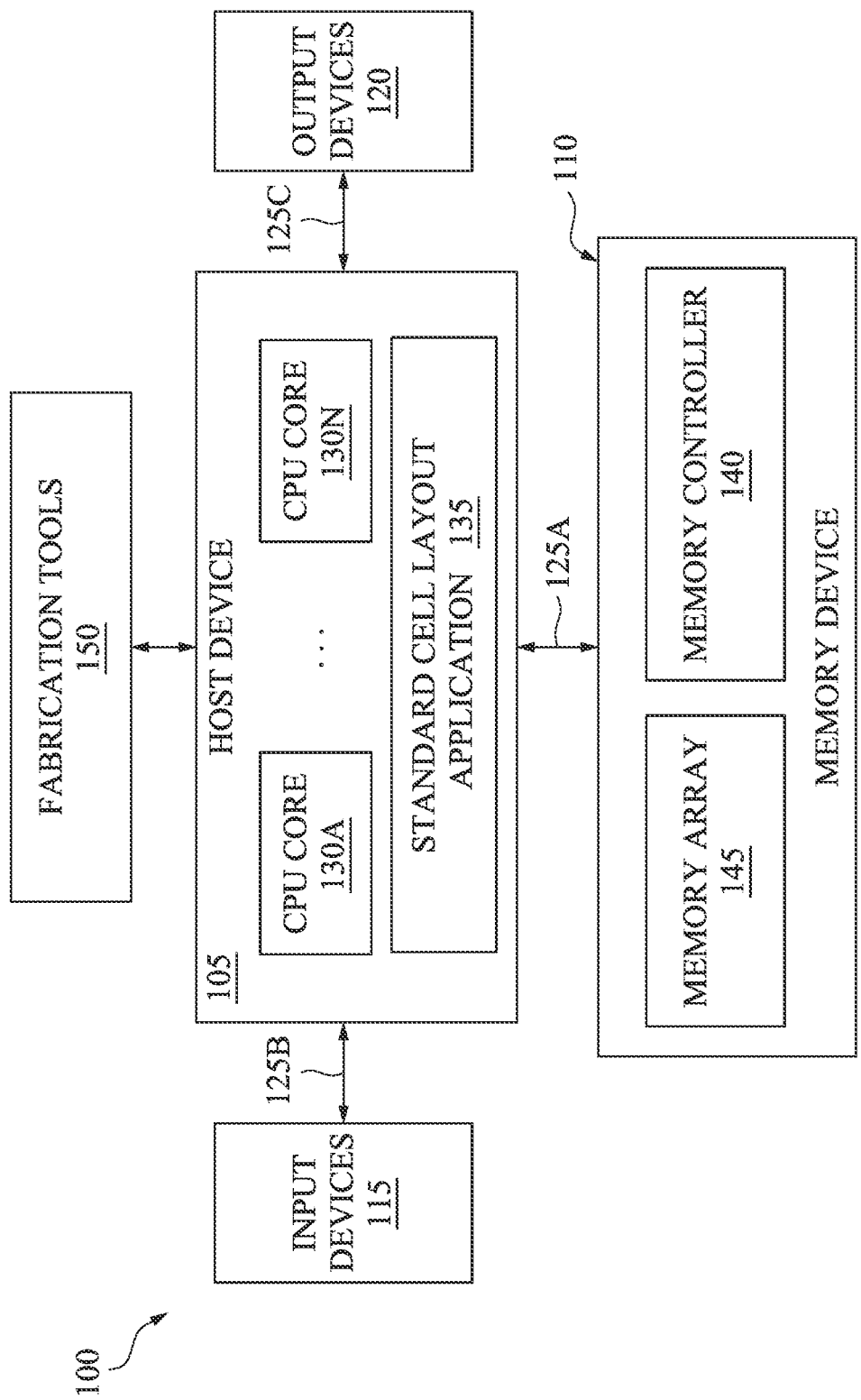
FIG. 1 is an example block diagram of a computing system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring now to FIG. 1, an example block diagram of a computing system 100 is shown, in accordance with some embodiments of the disclosure. The computing system 100 may be used by a circuit or layout designer for performing a standard cell layout of a circuit. A "circuit" or "integrated circuit" as used herein is an interconnection of electrical components such as resistors, transistors, switches, batteries, inductors, or other types of semiconductor devices configured for implementing a desired functionality. The computing system 100 includes a host device 105 associated with a memory device 110. The host device 105 may be configured to receive input from one or more input devices 115 and provide output to one or more output devices 120. The host device 105 may be configured to communicate with the memory device 110, the input devices 115, and the output devices 120 via appropriate interfaces 125A, 125B, and 125C, respectively. The computing system 100 may be implemented in a variety of computing devices such as computers (e.g., desktop, laptop, servers, data centers, etc.), tablets, personal digital assistants, mobile devices, other handheld or portable devices, or any other computing unit suitable for performing standard cell layout using the host device 105.

The input devices 115 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 105 and that allows an external source, such as a user (e.g., a circuit or layout designer), to enter information (e.g., data) into the host device and send instructions to the host device. Similarly, the output devices 120 may include a variety of output technologies such as external memories, printers, speakers, displays, microphones, light emitting diodes, headphones, video devices, and any other output peripherals that are configured to receive information (e.g., data) from the host device 105. The "data" that is either input into the host device 105 and/or output from the host device may include any of a variety of textual data, circuit data, signal data, semiconductor device data, graphical data, combinations thereof, or other types of analog and/or digital data that is suitable for processing using the computing system 100.

The host device 105 includes or is associated with one or more processing units/processors, such as Central Processing Unit ("CPU") cores 130A-130N. The CPU cores 130A-130N may be implemented as an Application Specific Integrated Circuit ("ASIC"), Field Programmable Gate Array ("FPGA"), or any other type of processing unit. Each of the CPU cores 130A-130N may be configured to execute instructions for running one or more applications of the host device 105. In some embodiments, the instructions and data needed to run the one or more applications may be stored within the memory device 110. The host device 105 may also be configured to store the results of running the one or more applications within the memory device 110. Thus, the host device 105 may be configured to request the memory device 110 to perform a variety of operations. For example, the host device 105 may request the memory device 110 to read data, write data, update or delete data, and/or perform management or other operations.

One such application that the host device 105 may be configured to run may be a standard cell layout application 135. The standard cell layout application 135 may be part of a computer aided design or electronic design automation software suite that may be used by a user of the host device 105 to create a standard cell layout (also referred to herein as "layout," "layout diagram," "layout design," and the like) of a circuit. A standard cell layout of the circuit may show various components and connections of the circuit to be fabricated. For example, the standard cell layout may show one or more active regions, gate electrodes, source and drain electrodes, metal lines, via contacts, openings for bonding pads, one or more metal layers, power sources, input and output signals, clock signals, etc. representing the various components of the circuit, and how those components are interconnected when disposed in/on a semiconductor substrate (such as a silicon wafer). The standard cell layout may be implemented by following a design procedure that may include one or more of logic design, physical design, or place and route. The standard cell layout may be expressed in one or more data files such as GDSII file format or DFII file format. In other embodiments, other file formats may be used. Thus, using the standard cell layout application 135, a circuit designer may create a standard cell layout of a circuit. In some embodiments, the instructions needed to execute or run the standard cell layout application 135 may be stored within the memory device 110. The standard cell layout application 135 may be executed by one or more of the CPU cores 130A-130N using the instructions associated with the standard cell layout application from the memory device 110.

Referring still to FIG. 1, the memory device 110 includes a memory controller 140 that is configured to read data from or write data to a memory array 145. In some embodiments, the memory array 145 may include a variety of volatile and/or non-volatile memories. For example, in some embodiments, the memory array 145 may include NAND flash memory cores, NOR flash memory cores, Static Random Access Memory (SRAM) cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory array. Generally speaking, the memory array 145 may include any of a variety of Random Access Memory (RAM), Read-Only Memory (ROM), Programmable ROM (PROM), Erasable PROM (EPROM), Electrically EPROM (EEPROM), hard disk drives, flash drives, memory tapes, optical drives, cloud memory, or any combination of primary and/or secondary memory that is suitable for performing the operations described herein. The memories within the memory array 145 may be individually and independently controlled by the memory controller 140. In other words, the memory controller 140 may be configured to communicate with each memory within the memory array 145 individually and independently. By communicating with the memory array 145, the memory controller 140 may be configured to read data from or write data to the memory array in response to instructions received from the host device 105. Although shown as being part of the memory device 110, in some embodiments, the memory controller 140 may be part of the host device 105 or part of another component of the computing system 100 and associated with the memory device. The memory controller 140 may be implemented as a logic circuit in either software, hardware, firmware, or combination thereof to perform the functions described herein. For example, in some embodiments, the memory controller 140 may be configured to retrieve the instructions associated with the standard cell layout application 135 stored in the memory array 145 of the memory device 110 upon receiving a request from the host device 105.

In some embodiments, the computing system 100 may also be associated with various fabrication tools 150. Among other things, the fabrication tools 150 may be used to prepare and fabricate a set of masks based on the standard cell layout created by the standard cell layout application 135. The set of masks may define the geometry for the photolithography steps used during semiconductor fabrication of the circuit. Although the fabrication tools 150 are shown separate from the host device 105, in some embodiments, at least some of the functionality of the fabrication tools may be implemented by the host device such as by the standard cell layout application 135 or another application associated with the standard cell layout application.

To prepare a set of masks, the fabrication tools 150 may be used to translate the standard cell layout of the circuit into a representative data file ("RDF"). The RDF may then be used to fabricate a set of physical masks to fabricate the circuit.

In some embodiments, preparing the set of masks may include performing an optical proximity correction ("OPC")

using lithography enhancement techniques to compensate for image errors, such as those that can arise from diffraction, interference, other process effects and the like, in the standard cell layout. In some embodiments, a mask rule checker ("MRC") of the fabrication tools 150 may check the standard cell layout that has undergone processes in OPC with a set of mask creation rules. The mask creation rules may contain certain geometric and/or connectivity restrictions to ensure sufficient margins, to account for variability in semiconductor manufacturing processes, and the like. In some embodiments, the MRC may modify the standard cell layout to compensate for limitations during the fabrication of the set of masks. In some embodiments, preparing the set of masks may also include resolution enhancement techniques ("RET"), such as off-axis illumination, sub-resolution assist features, phase-shifting masks, other suitable techniques, and the like or combinations thereof.

The preparation of the set of masks may further include, in some embodiments, lithography process checking ("LPC") that may simulate processes implemented to fabricate the circuit. LPC may simulate these processes based on the standard cell layout to create a simulated manufactured device of the circuit. LPC may take into account various factors, such as aerial image contrast, depth of focus ("DOF"), mask error enhancement factor ("MEEF"), other suitable factors, and the like or combinations thereof, to simulate the fabrication of the circuit. In some embodiments, after a simulated manufactured device has been created by LPC, if the simulated device does not satisfy certain design rules, OPC and/or MRC may be repeated to further refine the standard cell layout.

To fabricate the set of masks, a mask writer may convert the RDF to an image on a substrate, such as a mask (reticle) or a semiconductor wafer. In some embodiments, an electron-beam (e-beam) or a mechanism of multiple e-beams may be used to form a mask pattern on a semiconductor wafer to form the mask. In some embodiments, the mask pattern may include one or more opaque regions and one or more transparent regions. A radiation beam, such as an ultraviolet ("UV") beam, used to expose the image sensitive material layer (e.g., photoresist) which has been coated on the semiconductor wafer, may be blocked by the opaque regions and transmits through the transparent regions. In one example, the mask pattern may include a transparent substrate (e.g., fused quartz) and an opaque material (e.g., chromium) coated in the opaque regions to form the mask. In other embodiments, other or additional techniques may be used to fabricate the masks.

Once the masks are fabricated, a fabrication entity (e.g., a manufacturing facility or semiconductor foundry) may use the fabricated masks to fabricate the circuit. In some embodiments, fabricating the circuit may involve depositing one or more materials in/on a semiconductor wafer using the mask (or masks). The semiconductor wafer may include a silicon substrate or other substrate having material layers formed thereon. The semiconductor wafer may further include one or more of various doped regions, dielectric features, multilevel interconnects, and the like formed using one or more of the masks.

It is to be understood that although the fabrication tools 150 are described as performing certain operations for preparing the set of masks and then fabricating the set of masks, in some embodiments, the various processes may vary from those described. In some embodiments, additional or other processes or operations may be used to prepare the set of masks and fabricate the set of masks. It is also to be understood that only some components of the computing system 100 are shown and described in FIG. 1. However, the computing system 100 may include other components such as various batteries and power sources, networking interfaces, routers, switches, external memory systems, controllers, etc. Generally speaking, the computing system 100 may include any of a variety of hardware, software, and/or firmware components that are needed or considered desirable in performing the functions described herein. Similarly, the host device 105, the input devices 115, the output devices 120, and the memory device 110 including the memory controller 140 and the memory array 145 may each include other hardware, software, and/or firmware components that are considered necessary or desirable in performing the functions described herein.

Figure 2:
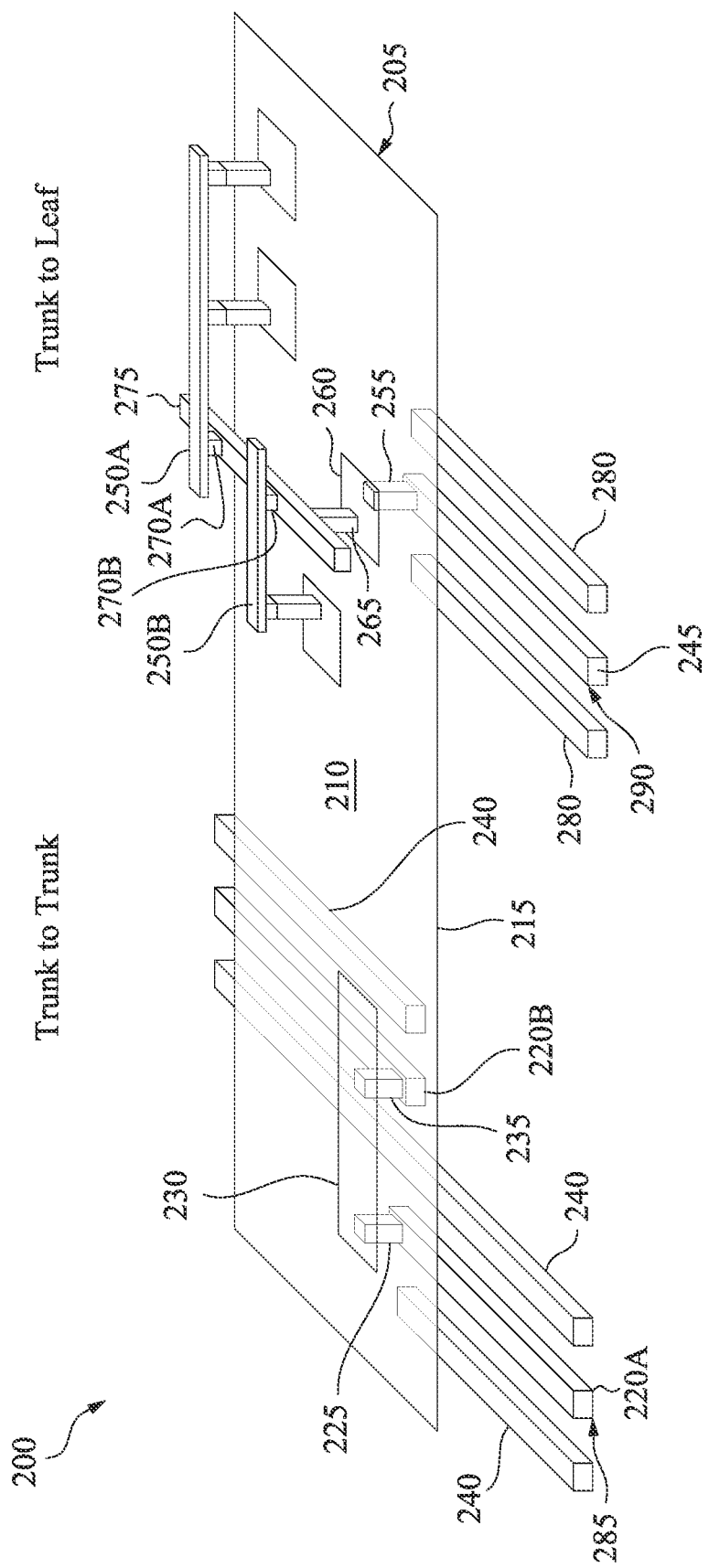
FIG. 2 is an example layout of a back-side clock tree implementation, in accordance with some embodiments.

Turning to FIG. 2, an example layout 200 of a clock tree implementation is shown, in accordance with some embodiments of the present disclosure. Specifically, the layout 200 includes a semiconductor substrate (referred to herein as simply "substrate") 205. The substrate 205 includes a first side 210 and a second side 215 opposite the first side. In some embodiments, the first side 210 may be considered a top side (or top surface) or a front side (or front surface) and the second side 215 may be considered a bottom side (or bottom surface) or a back side (or back surface). The "front" or "top" side of the substrate 205 is the side or surface on which the active devices (e.g., transistors, resistors, etc.) of an integrated circuit are formed. The opposite side of the "front" or "top" side is the "back" or "bottom" side of the substrate 205. In other words, the side or surface on which the active devices of an integrated circuit are not formed is the "back" or "bottom" side of the substrate 205. It is to be understood that the substrate 205 is shown transparent or clear simply to show the elements on the first side 210 and the second side 215 and how those elements are connected. The substrate 205 may generally be opaque or less than transparent. Further, although not apparent from FIG. 2, the substrate 205 may have a certain thickness and the shape/size of the substrate may vary from one embodiment to another.

Conventionally, all integrated circuits and associated connections are formed on the first side 210. Thus conventionally, a clock tree, which may provide a clocking signal to the integrated circuits, is also provided on the first side 210. Generally speaking, a clock tree is a clock distribution network that provides clocking signals to various components of the integrated circuits. The terms "clock signal," "clock," "clocking signal," "clock tree signal," "clock tree," and the like are used interchangeably herein. The clock tree signals may be routed throughout the integrated circuits using signal routing or routing resources (e.g., metal layers such as M0 layer, M1 layer, etc.). The routing resources, as used throughout the disclosure, may be any type of suitable signal routing that is configured to route an electrical signal from one point on an integrated circuit to another point on the integrated circuit. In some embodiments, a clock tree may include one or more reference clocks. In some embodiments, one or more of the reference clocks may be synthesized to generate one or more output clocks. The output clocks may be routed to various synchronous components of the integrated circuits to control operation of those components. In some embodiments, each reference clock of a clock tree may be considered a clock "trunk," while each output clock of the clock tree may be considered a clock "branch" or "leaf" The terms "clock trunk," "clock trunk signal," and the like are used interchangeably herein. Similarly, the terms "clock leaf" "clock leaf signal," and the like are used interchangeably herein. The clock trunk signals and the clock leaf signals may be routed throughout the integrated circuits using routing resources. Further, in some embodiments, a clock tree may be designed in various topologies, such as mesh, H-tree, etc. Conventionally, the routing resources of the clock tree, including all the clock trunks and all the clock leaves are provided on the first side 210. Further, the routing resources of the clock tree, including all the clock trunks and the clock leaves, consume a significant amount of area on the substrate 205.

Additionally, in some embodiments, clock signals, and particularly, clock trunk signals, may be high frequency signals that may be impacted by neighboring signals. Since clock signals may be considered critical signals and may impact chip speed, in some embodiments, to protect the clock signals, shielding around the routing resources of the clock signals may be used. In some embodiments, power and ground signals (e.g., VDD (high voltage) and VSS (ground) power rail), which provide power to the integrated circuits on the substrate 205, may be used to provide shielding to the clock tree. In some embodiments, shielding may involve sandwiching a clock signal routing resource between two power and ground signal tracks. For example, in some embodiments, the routing resource of a clock signal may be sandwiched between a power signal (e.g., VDD signal) and a ground signal (e.g., VSS signal). In some embodiments, the power and ground signals may be provided on the second side 215 and may be fed through the substrate 205 to the first side 210. By providing the power and ground signals on the second side 215, a standard cell height may be reduced and the current resistance (IR) drop at advanced nodes in an integrated circuit may be improved.

When the power and ground signals are on the second side 215 of the substrate 205 and the clock signals are on the first side 210 of the substrate, the power and ground signals that provide shielding to those clock signals need to be fed from the second side to the front side. Such feeding through of the power and ground signals to the first side 210 leads to consumption of extra routing resources. Thus, in some embodiments, the routing resources of at least a portion of the clock signals of a clock tree may be routed on the second side 215. By routing (e.g., by providing the routing resources of) at least a portion of the clock tree on the second side 215, the need to feed the power and ground signals from the second side 215 to the first side 210 for shielding may be avoided. Further, by routing at least a portion of the clock tree on the second side 215, the routing resources on the first side 210 that would otherwise be consumed by those clock signals may be released and used by other components.

Additionally, by routing at least a portion of the clock tree on the second side 215, the routing resources of the clock tree may be provided using low resistance interconnect layers without via stacking. Specifically, in some embodiments, when all the clock signals of a clock tree are provided on the first side 210, those clock signals may be provided in higher interconnect layers (e.g., Metal 2, Metal 3, etc.) to accommodate other integrated circuit components in the lower interconnect layers. Higher the interconnect layer or farther a signal from the substrate 205, lower is the resistance in that layer and signals connected by those higher interconnect layers. However, to reach the higher interconnect layers, a stacking of vias may be needed. A via may be used to provide a conductive connection from one conductive interconnect layer to another conductive interconnect layer. By routing at least a portion of the clock tree on the second side 215, similar resistance may be achieved without via stacking or at least the number of vias that would otherwise be needed on the first side 210 may be reduced.

Thus, routing at least a portion of the clock tree on the second side 215 leverages the power and ground signals on the second side, while providing the ability for routing using lower resistance interconnect layers, reducing via stacking, and releasing routing resources on the first side 210 for other signals. In some embodiments, the clock signals of the clock tree that are routed on the second side 215 may include those clock signals that require shielding. For example, in the embodiments in which clock trunk signals require shielding, the clock trunk signals (including H-trees and mesh) may be routed on the second side 215, while the clock leaves may continue to be routed on the first side 210. In other embodiments, if clock leaf signals need shielding, those clock signals may also be routed on the second side 215. In some embodiments, clock signals that do not necessarily require shielding may also be routed on the second side 215 and/or some clock signals that require shielding may continue to be routed on the first side 210 depending upon the back side resources that are available on the second side 215. In some embodiments, the term "back side resources" may mean back side pin connections on the second side 215. In some embodiments, the term "back side resources" may additionally or alternatively include other elements that may be needed to route a signal on the second side 215. As discussed below in greater detail, in some embodiments, the second side 215 may not be configured with back side pin connections. In such instances, a bridging cell such as a buffer or inverter having pins on the second side 215 may be inserted on the substrate 205.

FIG. 2 shows an example in which clock trunk signals may be routed on the second side 215 and the clock leaf signals may be routed on the first side 210. Specifically, FIG. 2 shows a trunk-to-trunk interconnection on the left side of the substrate 205 and a trunk-to-leaf interconnection on the right side of the substrate. Since, in some embodiments, the clock trunk signals may be routed on the second side 215, the trunk-to-trunk interconnection may be formed on the second side. Further, since, is some embodiments, the clock trunk signals may be routed on the second side 215 and the clock leaf signals may be routed on the first side 210, the trunk-to-leaf interconnections may be formed by feeding through the clock trunk signals from the second side to connect to the clock leaf signals on the first side. It is to be understood that the trunk-to-trunk interconnections and trunk-to-leaf interconnections are shown on separate portions of the substrate 205 simply for ease of explanation. In other embodiments, trunk-to-trunk interconnections and trunk-to-leaf interconnections may be provided together or on separate substrates.

To form a trunk-to-trunk interconnection, the routing resources of at least two clock tree signals (e.g., clock trunk signals 220A and 220B) may be interconnected. In some embodiments, the clock trunk 220A (e.g., the routing resource associated with the clock trunk 220A) may be connected through a via 225 to a clock buffer or clock gating cell 230 that provides clock distribution and power dissipation. Similarly, the clock trunk 220B (e.g., the routing resource associated with the clock trunk 220B) may be connected through a via 235 to the clock buffer or clock gating cell 230. Thus, the clock buffer or clock gating cell 230 provides an interconnection between the routing resources of the clock trunk signal 220A and the clock trunk signal 220B through the vias 225 and 235. In some embodiments, to provide the interconnection between multiple clock trunk signals, the clock buffer or clock gating cell 230 may be oriented/connected to have input and output pins on the same side (e.g., the second side 215). In some embodiments, if the substrate 205 is configured with back side pin connections on the second side 215, the clock trunk signals 220A and 220B may be connected directly to those back side pin connections without the need for the clock buffer or clock gating cell 230 or the vias 225, 235. Further, in some embodiments, the routing resources of the clock trunk signals 220A and 220B may be flanked on either side by shielding 240. In some embodiments, the shielding 240 may be part of the power and ground signals provided on the second side 215.

To form a trunk-to-leaf interconnection, the routing resource of a clock trunk signal on the second side 215 may need to be fed through and connected to the routing resources of one or more clock leaf signals on the first side 210. For example, the routing resources of a clock trunk signal 245 on the second side 215 may be connected to the routing resources of clock leaf signals 250A and 250B on the first side 210. The routing resources of the clock trunk signal 245 may be connected through a via 255 to a clock buffer or clock gating cell 260 on the second side 215. The routing resources of the clock leaf signals 250A and 250B may also be connected to the clock buffer or clocking gating cell 260 on the first side 210 through one or more vias 265, 270A, 270B and one or more metal interconnections 275. Thus, the clock buffer or clock gating cell 260 provides a conductive connection between the second side 215 and the first side 210.

In some embodiments, to facilitate connection between clock signals on the first side 210 and clock signals on the second side 215, the clock buffer or clock gating cell 260 may include input pins on one side (e.g., the second side) and output pins on the other side (e.g., the first side). An example of a buffer cell having input and output pins on the opposite sides is discussed below. Thus, clock buffer or clock gating cells (e.g., the clock buffer and gating cells 230, 260) may be used to provide trunk-to-trunk interconnections as well as trunk-to-leaf interconnections. Further, similar to the clock trunk signals 220A and 220B having the shielding 240, the clock trunk signal 245 may have shielding 280. In some embodiments, the shielding 280 may be formed from power and ground signals on the second side 215.

It is to be understood that the configuration of the trunk-to-trunk interconnection and the trunk-to-leaf interconnection shown in FIG. 2 is only an example and several variations are contemplated and considered within the scope of the present disclosure. For example, although only two clock trunk signals (e.g., the clock trunk signal 220A and 220B) forming the trunk-to-trunk interconnection are shown in FIG. 2, in other embodiments, more than two clock trunk signals may be provided and interconnected to form one large trunk-to-trunk interconnection or multiple trunk-to-trunk interconnections. In other embodiments, a single clock trunk signal may be provided. Similarly, although each of the clock trunk signal 220A and 220B are shown as being connected to the clock buffer or clock gating cell 230 through a single via (e.g., the via 225, 235), in other embodiments, either or both of those clock trunk signals may be connected to the clock buffer or clock gating cell by more than one via stacked on top of each other and/or through a combination of one or more back side interconnect layers and one or more vias. The back-side interconnect layers are described in greater detail below.

Further, although not shown, each of the clock trunk signals 220A and 220B may be connected to one or more clock leaf signals on the first side 210 to form one or more trunk-to-leaf interconnections also. For example, in some embodiments, the clock trunk signal 220A may be connected to a clock buffer or clock gating cell (that is similar to the clock buffer or clock gating cell 260) through a via on an opposite side 285 to form one or more trunk-to-leaf interconnections, as explained above. The clock trunk signal 220B may similarly form one or more trunk-to-leaf interconnections. Further, the clock trunk signal 245 may be connected to other clock trunk signals to form trunk-to-trunk interconnections also. For example, the clock trunk signal 245 may be connected to a clock buffer or clock gating cell (that is similar to the clock buffer or clock gating cell 230) through a via on an opposite side 290 to form one or more trunk-to-trunk interconnections, as explained above. It is also to be understood that the orientation, size, and shape of each of the clock trunk signals 220A, 220B, and 245 may vary in other embodiments from that shown. Further, although the clock trunk signals 220A and 220B are shown substantially parallel in FIG. 2, in other embodiments, each of those clock trunk signals may be oriented in other directions and/or angles.

Additionally, although the clock trunk signal 245 is shown as being connected to two clock leaf signals (e.g., the clock leaf signals 250A and 250B) to form two trunk-to-leaf interconnections, in other embodiments, the clock trunk signal may be connected to a single clock leaf signal or more than two clock leaf signals. The shape, size, and orientation of each of the clock leaf signals 250A, 250B may vary in other embodiments. Further, although each of the clock leaf signals 250A, 250B has been shown as being connected to the clock buffer or clock gating cell 260 through a specific connection of vias (e.g., the vias 265, 270A, 270B) and metal layers (e.g., the metal layer 275), the number of vias and/or the number of metal layers may vary in other embodiments.

Moreover, while FIG. 2 describes an example in which clock trunk signals are on the second side 215 and the clock leaf signals are on the first side 210 of the substrate 205, in other embodiments, one or more clock trunk signals may be on the first side and/or one or more clock leaf signals may be on the second side.

Figure 3:
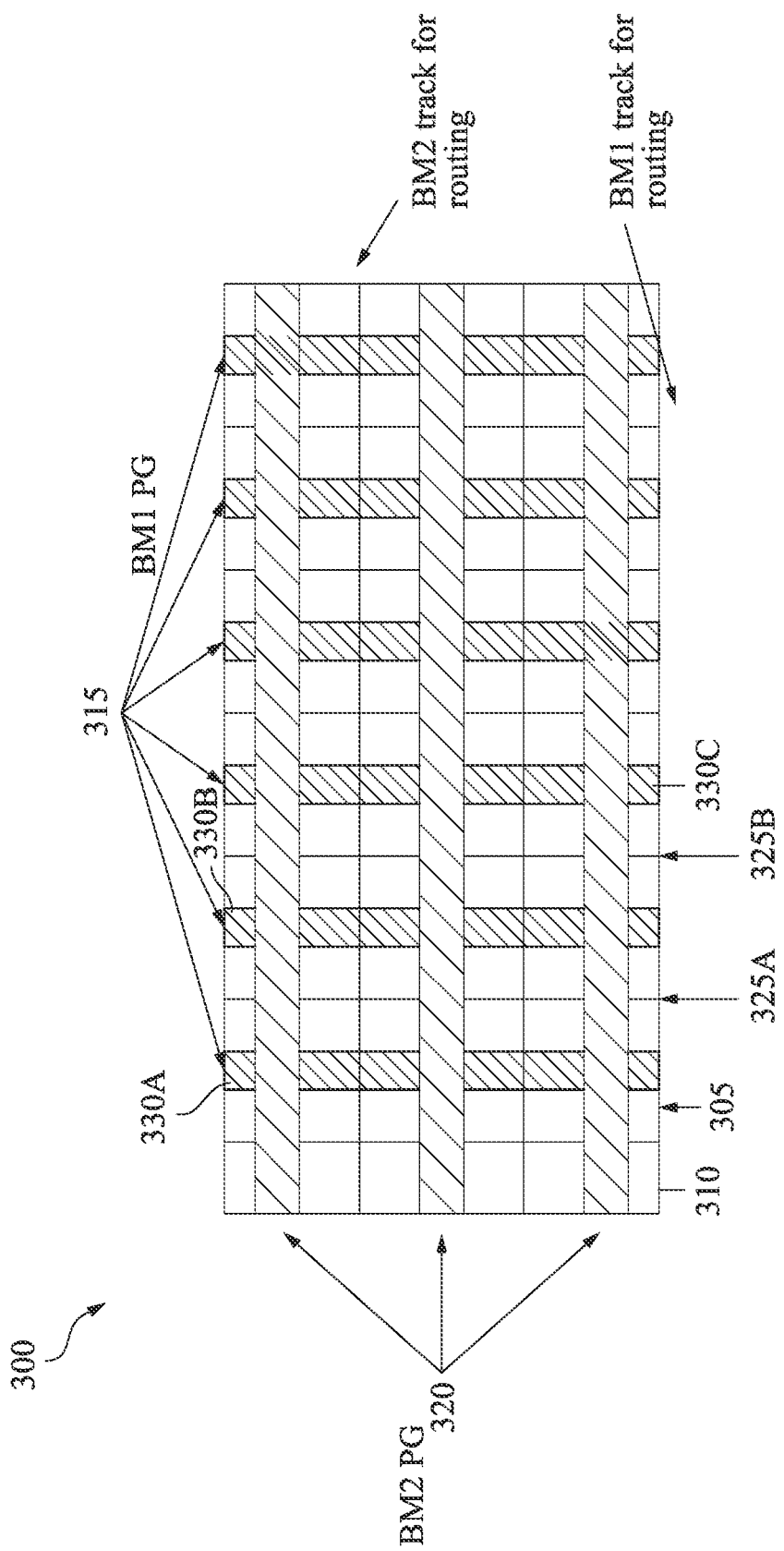
FIG. 3 is another example layout of the back-side clock tree implementation, in accordance with some embodiments.

Turning now to FIG. 3, another example layout 300 of a clock tree implementation is shown, in accordance with some embodiments of the present disclosure. The layout 300 shows a substrate 305. FIG. 3 shows a back side or second side 310 of the substrate 305. The second side 310 is analogous to the second side 215 of the substrate 205. As indicated above, in some embodiments, power and ground signals may be provided on the second side of the substrate. As also discussed above, in some embodiments, clock trunk signals may be provided on the second side and the power and ground signals may provide shielding to the clock trunk signals. In some embodiments, the power and ground signals, and the clock trunk signals may be routed in such a way that no extra routing resources may be needed to provide the shielding to the clock trunk signals.

For example and as shown in FIG. 3, in some embodiments, the power and ground signals may be routed through back side interconnect layers. Similar to the conductive interconnect layers (e.g., Metal 0, Metal 1, Metal 2, etc.) layers on the first side (referred to herein as "front side interconnect layers," "front side metal layers," and the like), the second side 215 may have conductive interconnect layers or routing resources, referred to herein as "back side interconnect layers," "back side metal layers," and the like (e.g., back side Metal 0, back side Metal 1, back side Metal 2, etc.). In some embodiments, the back-side interconnect layers are same or substantially similar in fabrication and operation to the front side interconnect layers. In some embodiments, the back-side interconnect layers may be somewhat wider than the front side interconnect layers. Since wider interconnect layers have lower resistance, by using wider back side interconnect layers on the second side 310, lower level back side interconnect layers may be used on the second side to achieve the same or similar resistance as higher level front side interconnect layers.

Thus, power and ground signals when provided on the second side 310 may be routed via back side interconnect layers. For example, in some embodiments, power and ground signals 315 may be routed through back side Metal 1 layer and power and ground signals 320 may be routed through back side Metal 2 layer. In some embodiments, the power and ground signals 315 and 320 extend in intersecting directions. Although the power and ground signals 315 are shown as extending in a substantially vertical direction and the power and ground signals 320 are shown extending in a substantially horizontal direction, in other embodiments, those power and ground signals may extend in other directions. Further, although the power and ground signals 315, 320 are shown as being routed through specific level back side interconnect layers (e.g., back side Metal 1 layer and back side Metal 2 layer), in other embodiments, those power and ground signals may be routed via other levels of back side metal layers (e.g., back side Metal 0 layer, back side Metal 3 layer, etc.) and/or may be routed via additional or fewer back side metal layers.

In some embodiments, a clock trunk signal may be routed between two power and ground signals tracks for natural shielding. For example, the routing resources of a clock trunk signal 325A may be provided between power and ground signal tracks 330A and 330B. Similarly, the routing resources of a clock trunk signal 325B may be provided between the power and ground signal 330B and power and ground signal 330C, and so on. Thus, clock trunk signals may alternate with power and ground signals such that each clock trunk signal is separated from another clock trunk signal by a power and ground signal track, which provide shielding. Thus, the clock trunk signal 325A may be shielded by the power and ground signal tracks 330A and 330B, and so on. Further, the routing resources of the clock trunk signals 325A, 325B, and any other clock trunk signals extending in the same direction as the power and ground signal tracks 330A and 330B may be provided by the same level of the back-side interconnect layers. For example, if the power and ground signals 315 are provided by back side Metal 1 layer, the routing resources of the clock trunk signals 325A, 325B, etc., may also be provided by back side Metal 1 layer. Similarly, in some embodiments, back side Metal 2 layer may be used for clock trunk signals between the power and ground signals 320. In some embodiments, instead of separating each clock signal with a power and ground signal track, more than one clock signals may be provided between two power and ground signal tracks. Similarly, in some embodiments, two clock signals may be separated by more than one power and ground signal track.

Figure 4:
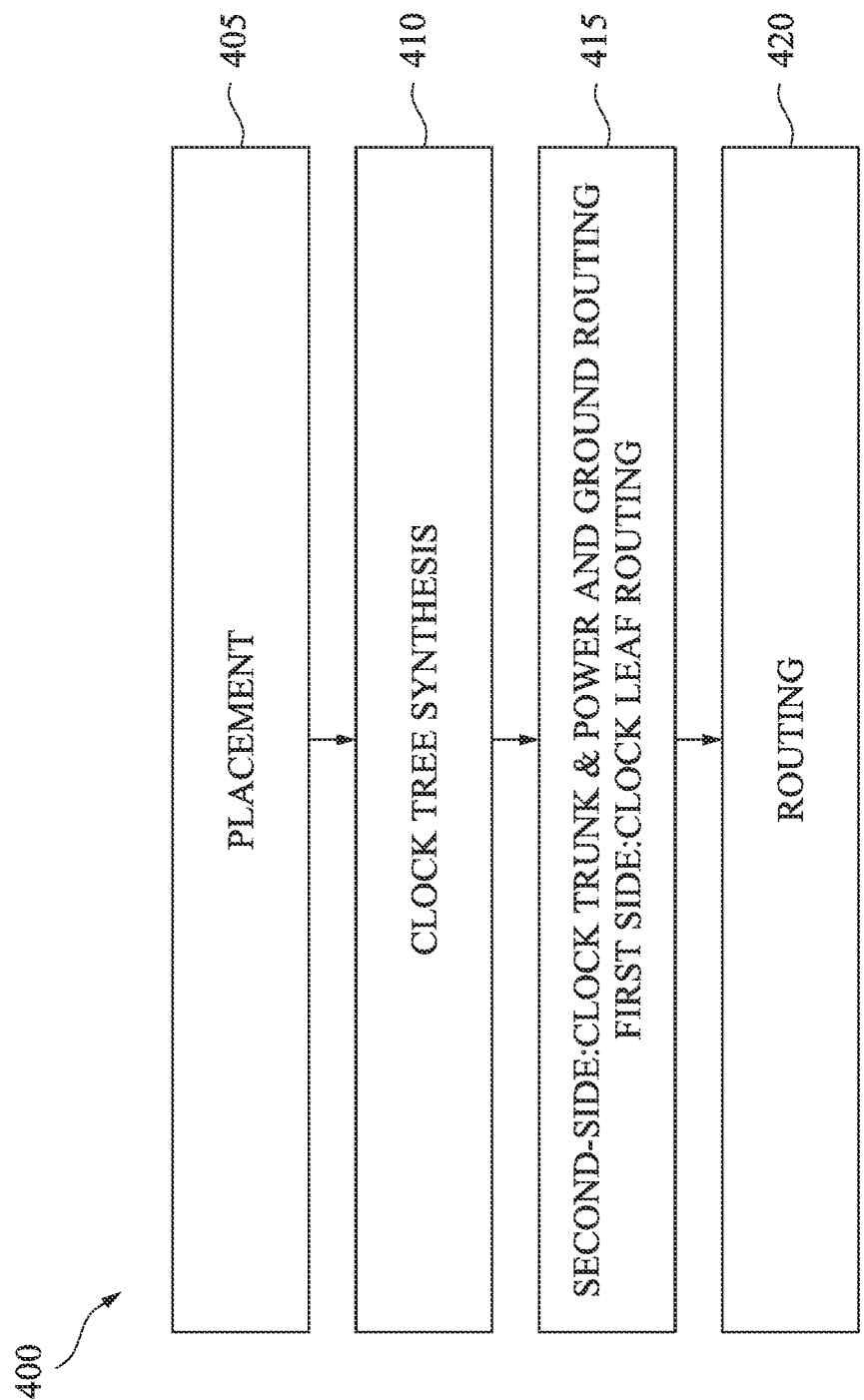
FIG. 4 is an example flowchart outlining operations for performing the layout of the back-side clock tree implementation, in accordance with some embodiments.

Referring to FIG. 4, an example flowchart outlining a process 400 for performing the layout of a clock tree implementation, as discussed above, is shown, in accordance with some embodiments of the present disclosure. The process 400 may include other or additional operations depending upon the embodiment. The process 400 may be implemented by the standard cell layout application 135. The process 400 of the clock tree implementation layout begins with a placement operation 405. During the placement operation 405 of the clock tree implementation, locations for various circuit components may be assigned, while optimizing various design constraints. Before the placement operation 405, a netlist and design constraints may be input into the standard cell layout application 135. A netlist may be a functionally equivalent logic gate-level circuit description provided through a synthesis process. The synthesis process forms a functionally equivalent logic gate-level circuit description by matching one or more behavior and/or functions to (standard) cells from a set of cell libraries. The behavior and/or functions may be specified based upon various signals or stimuli applied to the inputs of an overall design of the integrated circuit, and may be written in a suitable language, such as a hardware description language. Similarly, the design constraints may specify timing, process parameters, and other suitable constraints with which the input netlist, once physically formed into an integrated circuit, needs to comply.

At the placement operation 405, the synthesized netlist and the design constraints may be used to assign locations to various cells identified from the synthesized netlist. The placement of each cell within the cell rows, and the placement of each cell row in relation to other cell rows, may be guided by cost functions in order to minimize wiring lengths and area requirements of the resulting integrated circuit. The placement may be done either automatically or through a manual process, whereby the user may manually insert one or more cells into a cell row.

At operation 410, a clock tree synthesis operation is performed. During clock tree synthesis, clocking signals may be distributed through the integrated circuit design to synchronous components and the clock tree may be synthesized using clock buffers or clock gating cells. In some embodiments, the clock tree synthesis may include routing clock signals to minimize wiring lengths and reduce area requirements to optimize clock signal routing. At operation 415, the clock trunk signals of the clock tree may be provided on the second side 215 of the substrate 205 and the clock leaf signals may be provided on the first side 210. In some embodiments, the clock trunk signals may be alternated with power and ground signals on the second side 215 to provide automatic shielding, as discussed in FIG. 3 above. With all instances of cells and clocks placed, at operation 420, various signal nets may be routed using front side interconnection layers and back side interconnection layers, as discussed above. The routing using routing resources may be performed considering time implications, while minimizing design rule check violations.

Upon completing routing, the process 400 may determine whether the actual physical design for the overall integrated circuit matches desired design requirements. Various design requirements may be checked such as, for example, a timing quality of the actual physical design for the overall integrated circuit, a power quality of the actual physical design for the overall integrated circuit, whether a local congestion issue exists, etc., by performing one or more simulations using circuit simulators, e.g., Simulation Program with Integrated Circuit Emphasis (SPICE). If all the design requirements are met, the process 400 may proceed to fabrication via the fabrication tools 150 to generate, e.g., photolithographic masks, that may be used in physically manufacturing the physical design.

Figure 5:
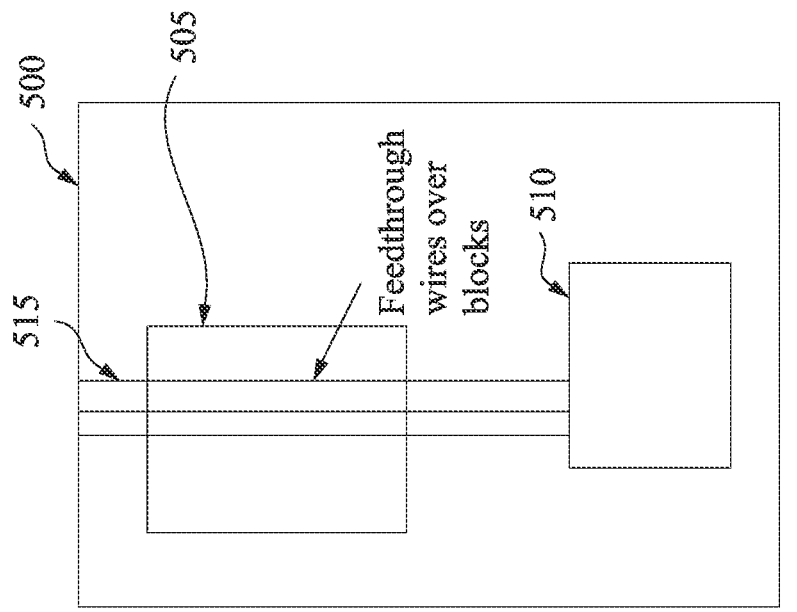
FIG. 5 is an example block diagram showing a feedthrough wire implementation, in accordance with some embodiments.

Referring to FIG. 5, an example of a feedthrough wire on a semiconductor substrate is shown, in accordance with some embodiments of the present disclosure. A top-level design of an integrated circuit or chip may include one or more blocks representing a level of hierarchy below the top-level design. Each block may itself include one or more groups of integrated circuits (e.g., combination of standard cells) having a designated function. A feedthrough wire is a signal wire that enters a block from one edge thereof and exits the block from another edge thereof without actually being connected to any component on the integrated circuit block. For example, FIG. 5 shows a top-level design 500 on which blocks 505 and 510 may be present. It is to be understood that although two blocks (e.g., the blocks 505 and 510) are shown on the top-level design 500, in other embodiments, the top level design may have greater than or fewer than two blocks. Wires 515 may be considered feedthrough wires for block 505 since those wires are not connected to any component of that block. Rather, the wires 515 are connected to the block 510 and simply pass through or cut through the block 505.

Conventionally, feedthrough wires (e.g., the wires 515) are routed using routing resources on the front side (e.g., the first side 210) of a semiconductor substrate (e.g., the substrate 205). Depending upon the length of the feedthrough wires and other factors that may impact signal integrity, in some embodiments, one or more repeaters may be used to overcome the resistance of long wires, as well as to maintain signal integrity. The feedthrough wires also consume higher resistance routing resources on the front side of the substrate that may otherwise be used to route and connect other components of the top-level design 500. In some embodiments, and as discussed below, at least some of the feedthrough wires (e.g., the wires 515) may be routed using routing resources on the back side (e.g., the second side 215) of the substrate. By routing at least some of the feedthrough wires on the back side of the substrate, routing resources may be released on the front side for use by other components. Further, as discussed above, the routing resources may be provided on the back side using wider back side interconnect metal layers having lower resistance. Thus, by routing at least some of the feedthrough wires on the back side of the substrate, the resistance of the feedthrough wires that are on the back side may naturally be reduced, thereby requiring fewer repeaters to reduce the overall repeater count in the top-level design 500. The repeaters themselves help with reducing resistance. Thus, using a combination of repeaters and lower resistance back side interconnect metal layers, the overall resistance of feedthrough wires on the back side may be reduced significantly compared to the resistance of those wires on the front side. Additionally and similar to the clock tree implementation, the power and ground signals may be leveraged as shielding to reduce noise or cross-talk with other neighboring signals.

Figure 6:
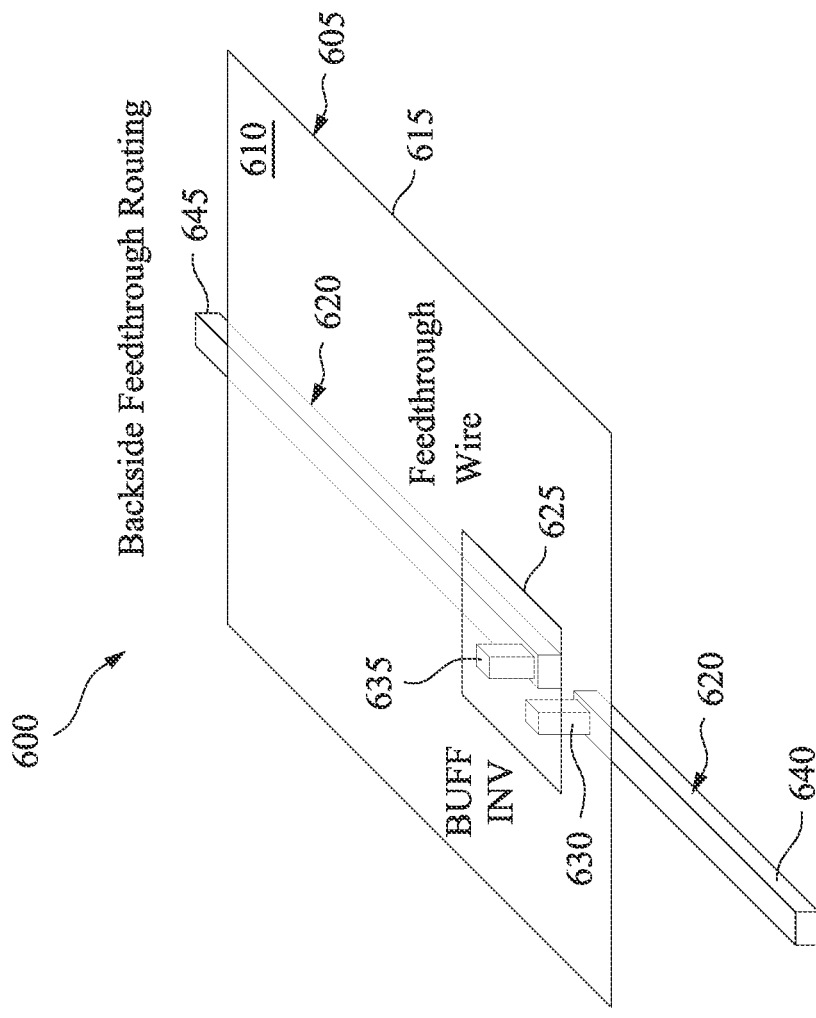
FIG. 6 is an example layout of a back-side feedthrough wire implementation, in accordance with some embodiments.

Turning to FIG. 6, an example layout 600 of feedthrough wires is shown, in accordance with some embodiments of the present disclosure. The layout 600 shows a substrate 605 having a first side 610 and a second side 615. The first side 610 is analogous to the first side 210 and the second side 615 is analogous to the second side 215. In other words, the first side 610 is the front side of the substrate 605, such that the integrated circuits are formed on the first side, while the second side 615 is the back side of the substrate. Further, it is to be understood that the substrate 605 is shown transparent to show the elements on the second side 615 of the substrate. The substrate 615 may not be transparent in other embodiments. Further, in some embodiments, power and ground signals may be provided/routed on the second side 615, as discussed above. In some embodiments, feedthrough wires may also be provided/routed on the second side 615.

For example and as shown in FIG. 6, a feedthrough wire 620 (e.g., the routing resources of the feedthrough wire) may be provided on the second side 615, thereby freeing routing resources on the first side 610. In some embodiments, repeaters may be used to route the feedthrough wire 620. In some embodiments, a buffer 625 (or inverter) may be used as a repeater. The buffer 625 may include input and output pins on the second side 615 to which the feedthrough wire 620 may connect to. In some embodiments, the routing resources of the feedthrough wire 620 may be configured to connect to the buffer 625 by way of vias 630 and 635. Specifically, in some embodiments, a first portion 640 of the routing resources of the feedthrough wire 620 may be connected through the via 630 to an input pin of the buffer 625 and a second portion 645 of the routing resources of the feedthrough wire may be connected through the via 635 to an output pin of the buffer, thereby maintaining continuity of conductive connection in the first and second portions of the feedthrough wire.

Although a single instance of the buffer 625 has been shown herein, in other embodiments, multiple number of such buffers may be used as desired. In some embodiments, it may be desirable to have a buffer at every predetermined length of the routing resources of the feedthrough wire 620. In other embodiments, other criteria may be used to determine where an instance of the buffer 625 is needed or desired. Further, although the routing resources for a single instance of the feedthrough wire 620 is shown in FIG. 6, it is to be understood that in other embodiments, all feedthrough wires or at least multiple feedthrough wires that would otherwise be provided/routed on the first side 610 may be provided/routed on the second side 615.

Figure 7A:
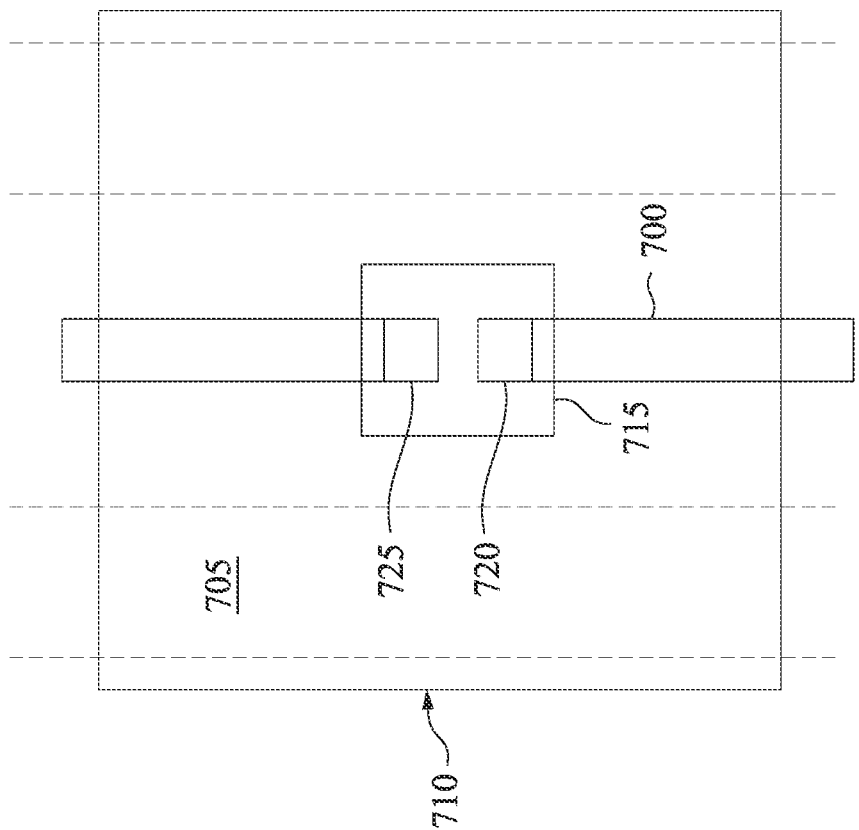
FIG. 7A is an example layout of a vertical back-side feedthrough wire implementation, in accordance with some embodiments.
Figure 7A:
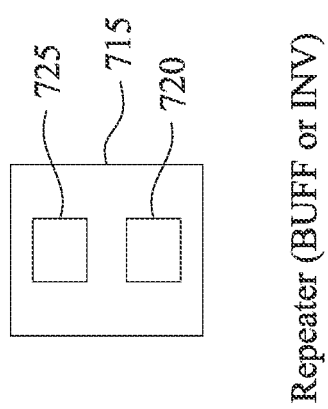
Figure 7B:
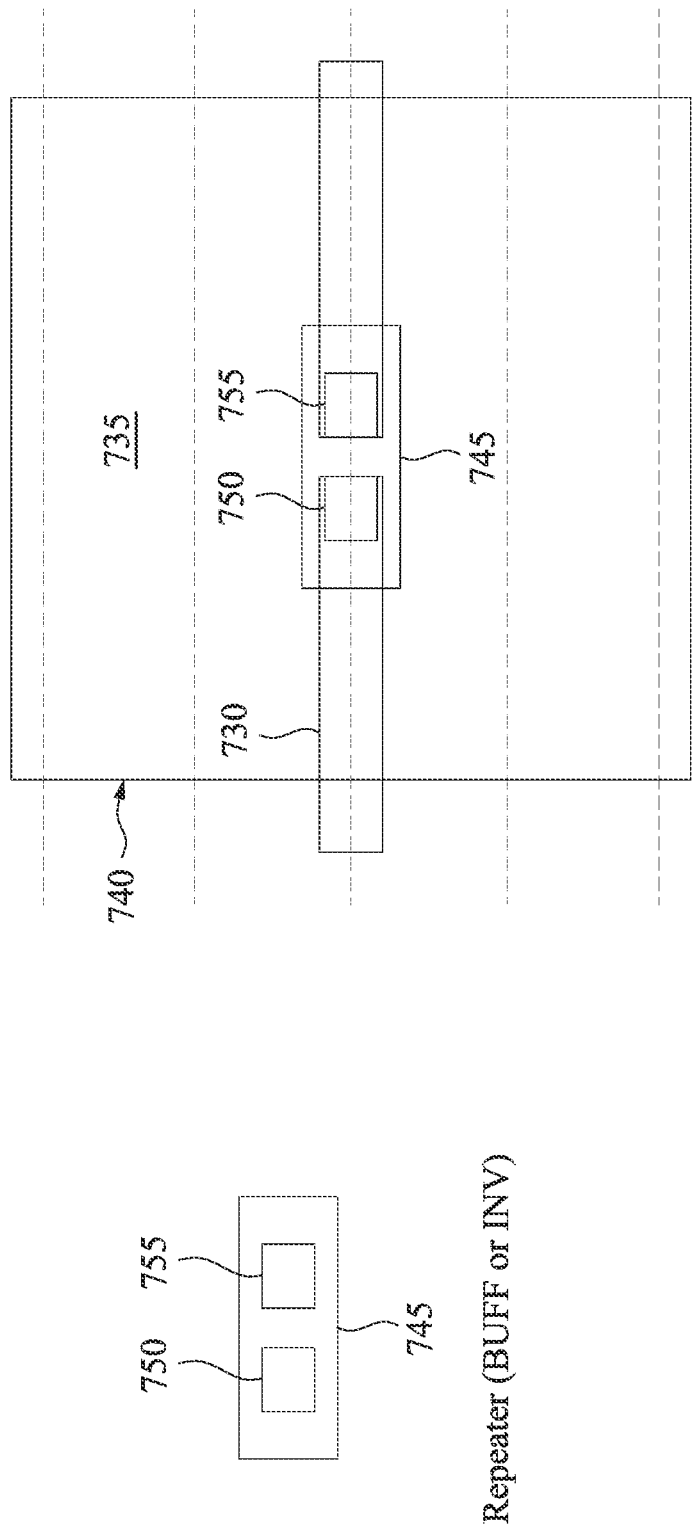
FIG. 7B is an example layout of a horizontal back-side feedthrough wire implementation, in accordance with some embodiments.

Turning to FIGS. 7A and 7B, vertical and horizontal orientations, respectively, of feedthrough wires are shown, in accordance with some embodiments of the present disclosure. Specifically, depending upon the orientation of the routing resources of the feedthrough wires, the orientation of the input and output pins on the repeater may vary. In some embodiments, for a vertically or substantially vertically (e.g., top-to-bottom) routed feedthrough wire, a repeater may have input and output pins that are also oriented in a vertical or substantially vertical direction. For example and as shown in FIG. 7A, a feedthrough wire 700 is routed on a back side (e.g., second side) 705 of a substrate 710 using routing resources in a vertical or substantially vertical orientation. A repeater 715 (e.g., buffer) may be used to route the feedthrough wire 700. The repeater 715 may include an input pin 720 and an output pin 725. The input pin 720 and the output pin 725 may be aligned in a vertical or substantially vertical direction (e.g., stacked on top of each other) to allow the routing resources of the feedthrough wire 700 to be routed vertically or substantially vertically.

In some embodiments, for a horizontally or substantially horizontally (e.g., left-to-right) routed feedthrough wire, a repeater may have input and output pins that are also horizontally or substantially horizontally aligned. For example and as shown in FIG. 7B, a feedthrough wire 730 may be routed using horizontally or substantially horizontally extending routing resources on a back side (e.g., second side) 735 of a substrate 740. A repeater 745 that is used with the feedthrough wire 730 may include an input pin 750 and an output pin 755. The input pin 750 and the output pin 755 may also be aligned horizontally or substantially horizontally (e.g., side by side) to allow the routing resources of the feedthrough wire 730 to be routed horizontally or substantially horizontally.

Figure 8:
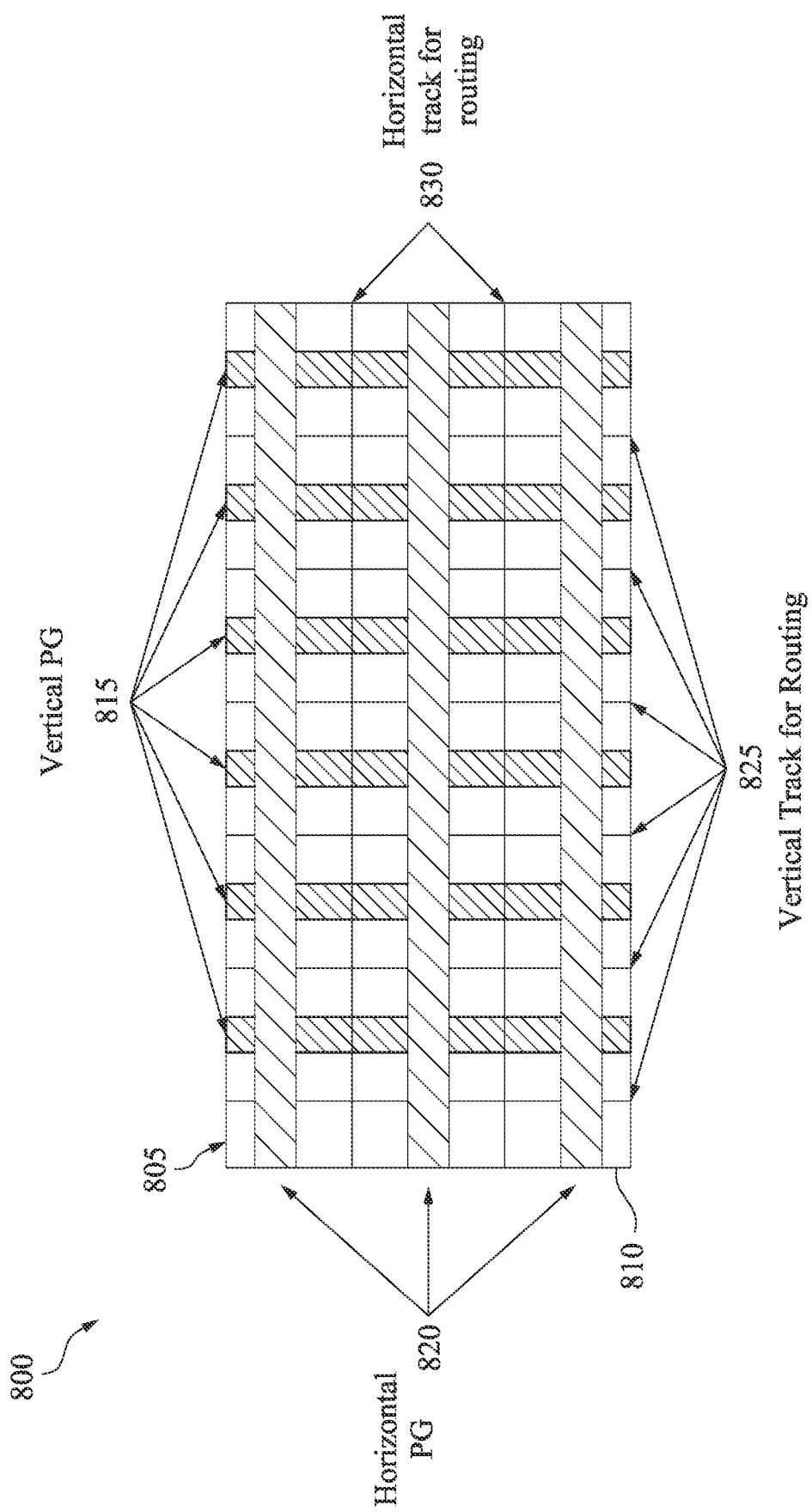
FIG. 8 is another example layout the back-side feedthrough wire implementation, in accordance with some embodiments.

Turning now to FIG. 8, another example layout 800 of a feedthrough wire implementation is shown, in accordance with some embodiments of the present disclosure. The layout 800 shows a substrate 805, and particularly, a back side or second side 810 of the substrate. The second side 810 is analogous to the second side 615 of the substrate 605. As indicated above, in some embodiments, power and ground signals may be provided on the second side 615 of the substrate 605 along with the feedthrough wires. In some embodiments, the power and ground signals and the routing resources of the feedthrough wires may be arranged/routed on the second side 810 in such a way that no extra routing resources are needed to provide the shielding to the feedthrough wires by the power and ground signals.

Specifically and as discussed above, the power and ground signals may be routed through back side interconnect layers (e.g., back side Metal 0, back side Metal 1, back side Metal 2, etc.) when those signals are provided on the second side 810 of the substrate 805. For example, in some embodiments, power and ground signal tracks 815 may be routed through first back side interconnect metal layer and power and signal tracks 820 may be routed through second back side interconnect metal layer. In some embodiments, the first back side interconnect metal layer and the second back side interconnect metal layer extend in intersecting directions at different levels. Further, although the power and ground signals 815 and 820 are shown as being routed through two back side interconnect metal layers only, in other embodiments, the power and ground signals may be routed through fewer than or greater than two back side interconnect metal layers.

Additionally, in some embodiments, feedthrough wires may be routed between two power and ground signals tracks using the same interconnect level/back side interconnect metal layer as the power and ground signal tracks extending in the same direction as the feedthrough wires. For example, the routing resources of the feedthrough wires 825 may be provided to alternate with the power and ground signal tracks 815 using the first back side interconnect metal layers. Similarly, the routing resources of the feedthrough wires 830 may be provided to alternate with the power and ground signal tracks 820 using the second back side interconnect metal layer. Thus, each feedthrough wire may alternate with power and ground signals such that each feedthrough wire is separated from another feedthrough wire by a power and ground signal track, which provide shielding. In some embodiments, instead of separating each feedthrough wire with a power and ground signal track, more than one feedthrough wire may be provided between two power and ground signal tracks. Similarly, in some embodiments, two feedthrough wires may be separated by more than one power and ground signal track.

Figure 9:
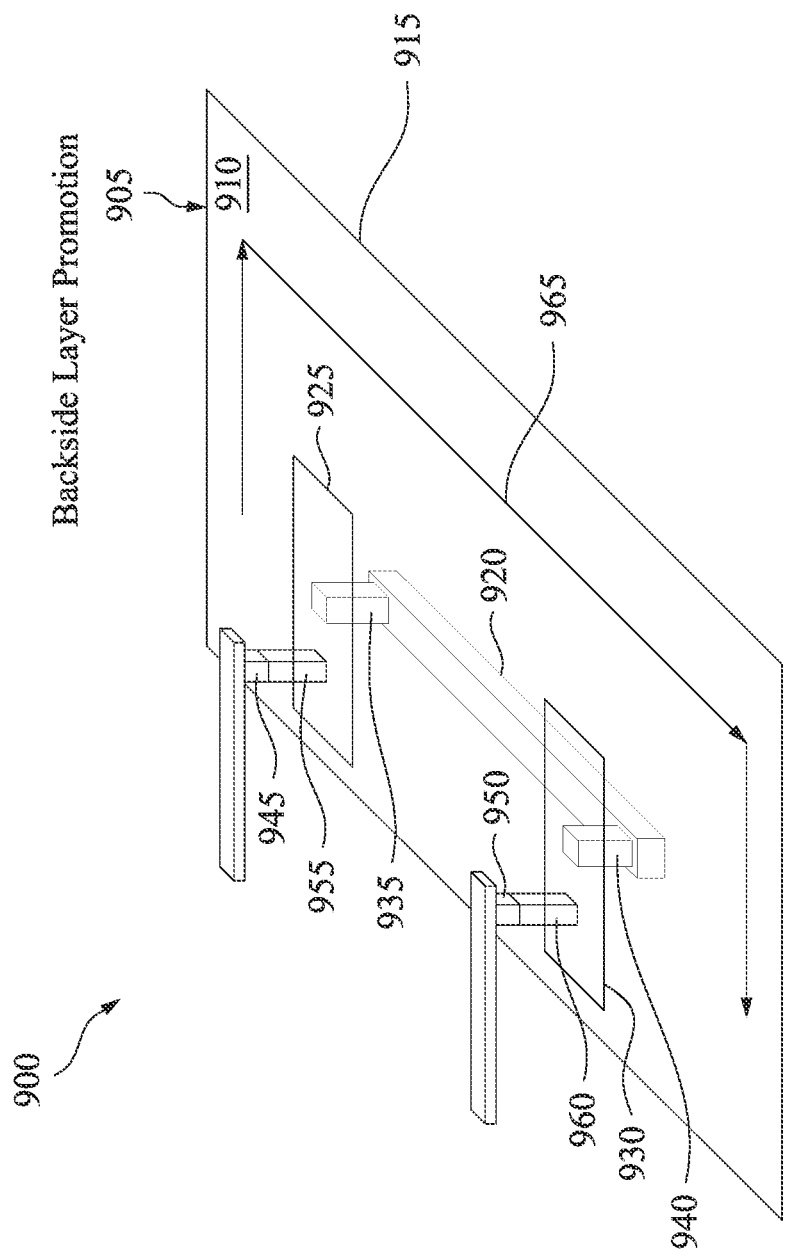
FIG. 9 is an example layout of a back-side layer promotion implementation, in accordance with some embodiments.

Referring to FIG. 9, an example layout 900 of a back-side layer promotion implementation is shown, in accordance with some embodiments of the present disclosure. With the back-side layer promotion implementation, timing critical nets may be moved from the front side of a substrate to the back side of the substrate. In conventional implementations, timing critical connections are typically promoted to higher metal layers on the front side of the substrate to lower the resistance of those critical connections. To promote the timing critical connections to the higher metal layers, via stacking is used such that multiple vias may be stacked on top of each other to reach the higher metal layers. In some embodiments, instead of using via stacking to reach the lower resistance metal layers, back side resources on the substrate may be used. Specifically, in some embodiments, the timing critical nets may be moved to the back side of the substrate to achieve the same, similar, or even lower resistance as the resistance on the front side of the substrate.

Thus, as shown in FIG. 9, a substrate 905 includes a first side 910 and a second side 915. The first side 910 is analogous to the first side 210 and corresponds to the front side of the substrate 905. The second side 915 is analogous to the second side 215 and corresponds to the back side of the substrate. The substrate 905 is shown transparent only to illustrate the features on the back side of the substrate. In other embodiments, the substrate 905 need not be transparent. As discussed above, the back-side interconnect layers used on the second side 915 may be wider metal layers than the front side interconnect layers used on the first side 910 of the substrate 905. By virtue of being wider, the back-side interconnect metal layers may be lower resistance layers. Thus, using the back-side interconnect layers on the second side 915, the same, similar, or even lower resistance may be achieved compared to a front side interconnect layer on the first side 910, making the back-side interconnect layers a suitable choice for timing critical nets. Further, the same, similar, or even lower resistance of the timing critical connections may be achieved using lower level back side interconnect layers on the second side 915 compared to the higher metal layers needed on the first side 910. Thus, via stacking may be completely avoided or at least a lower via stack may be needed to achieve the same, similar, or lower resistance on the second side 915 compared to the first side 910.

For example, the routing resources for a signal 920 may be provided on the second side 915. In some embodiments, the signal 920 may be a timing critical net that would conventionally be provided on the first side 910 using higher metal layers to achieve lower resistance. In other embodiments, the signal 920 may be another type of critical or non-critical net or long connection that would conventionally be provided on the first side 910 using higher metal layers or that requires low or lower resistance compared to other nets on the first side. The signal 920 may be fed through for connection to other nets on the first side 910. In some embodiments, the signal 920 may be fed through to the first side 910 using buffers 925 and 930. In some embodiments, the ends of the routing resources of the signal 920 may be connected to the buffers 925 and 930 on the second side 915 using vias 935 and 940, respectively. Similarly, on the first side 910, the buffers 925 and 930 may be connected to the routing resources of other signals 945 and 950 using vias 955 and 960, respectively. Thus, the buffers 925 and 930 may facilitate feed through of the signal 920 from the second side 915 to the first side 910, while providing the ability to reach low-resistance metal layers without via stacking.

For example, to flow current from the signal 945 to the signal 950 using the signal 920 and the buffers 925 and 930 and their respective routing resources, in some embodiments, the buffer 925 may have input pins on the first side 910 and output pins on the second side 915, while the buffer 930 may have input pins on the second side and output pins on the first side to provide a connection in a direction indicated by arrow 965. Similarly, in some embodiments in which it is desired to flow current from the net 950 to the net 945, the buffer 930 may have input pins on the first side 910 and output pins on the second side 915, while the buffer 925 may have input pins on the second side and output pins on the first side to provide a connection in a direction opposite to that indicated by the arrow 965. Thus, depending upon the desired connection, buffers having input and output pins on the appropriate sides may be used. In some embodiments, inverters may be used instead of buffers. The inverters may have similar pin configurations as discussed above for buffers. In some embodiments, if the substrate 905 is already configured with back side resources to include pins on the second side 915, the buffers 925 and/or 930 may not be needed and the signal 920 may connect directly to the pins of the back-side resources.

Further, in some embodiments, if the signal 920 is configured to connect to another net that is also on the second side 915, the buffers 925 and/or 930 may have input and output pins on the second side.

Figure 10:
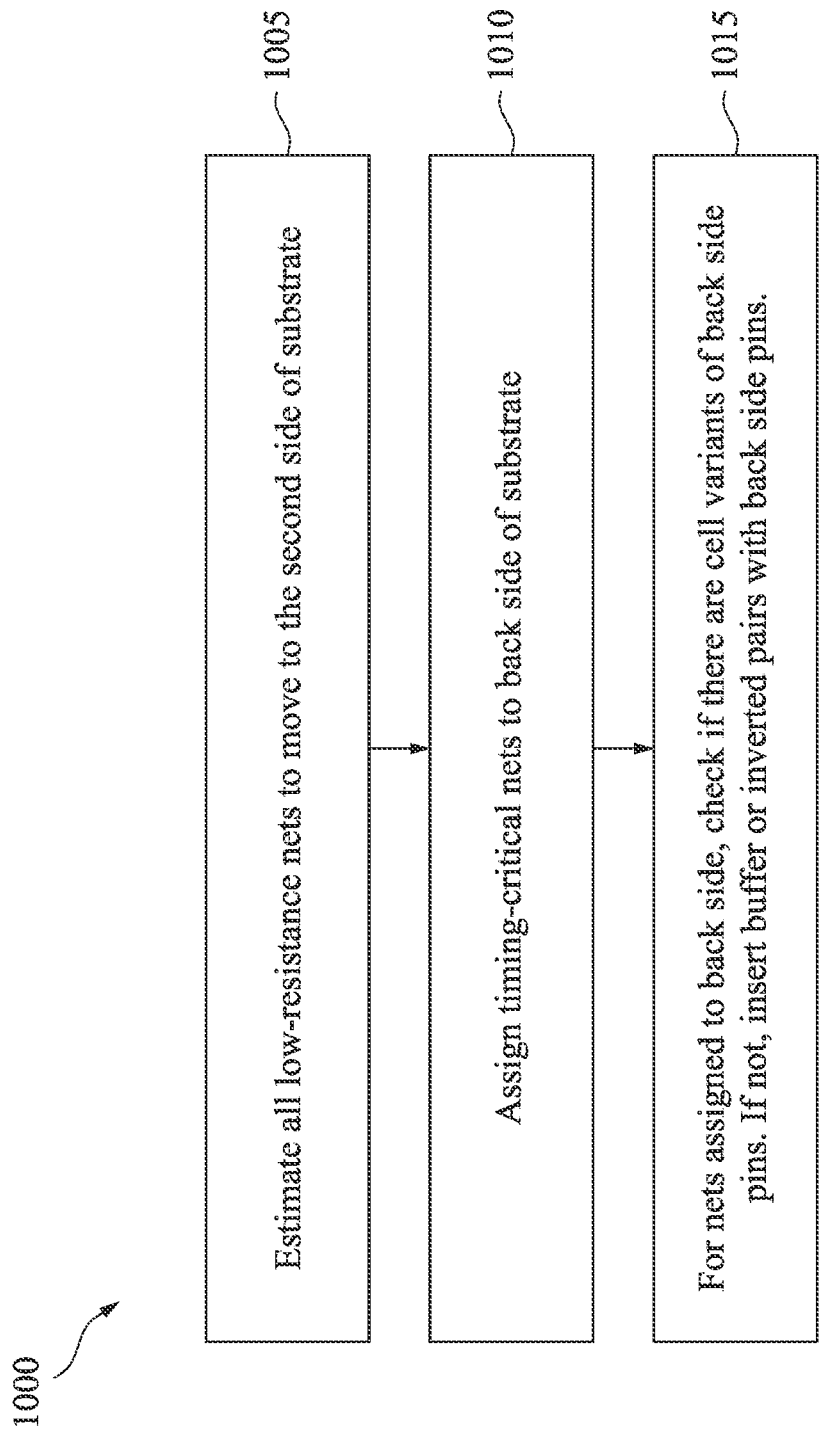
FIG. 10 is an example flowchart outlining operations for performing the layout of the back-side layer promotion implementation, in accordance with some embodiments.

Turning to FIG. 10, an example flowchart outlining operations of a process 1000 for providing the back-side layer promotion implementation of FIG. 9 is shown, in accordance with some embodiments of the present disclosure. The process 1000 may be implemented by the standard cell layout application 135. At operation 1005, low resistance nets may be identified on the first side 910 to be moved to the second side 915. It is to be understood that what constitutes "low" resistance may be predefined and nets that satisfy the definition of "low" resistance may be identified at this operation. For example, in some embodiments, nets that are at or above a certain metal layer (e.g., Metal 2, Metal 3, etc.) on the front side may be designated low resistance nets. In other embodiments, nets that require resistance to be at a certain predefined value may be considered low resistance nets.

At operation 1010, at least a subset of the low resistance nets may be selected to move to the second side 915 of the substrate 905. In some embodiments, timing critical long nets may be selected to move to the second side 915. In other embodiments, other types of the low resistance nets identified at the operation 1005 may additionally or alternatively be selected to move to the second side 915. At operation 1015, if the second side 915 is configured with back side pins, each of the timing critical long nets may be connected to those pins without needing buffers, as discussed above, to provide feedthrough to the first side 910. If the second side 915 of the substrate 905 is not configured with back side pins, in some embodiments, a pair of buffers (e.g., the buffers 925, 930) or inverters may be inserted for each timing critical long net being moved to the second side 915 and connected though vias (e.g., the vias 930, 935), as also discussed above, to connect the timing critical long net to other nets on the first side 910.

Figure 11A:
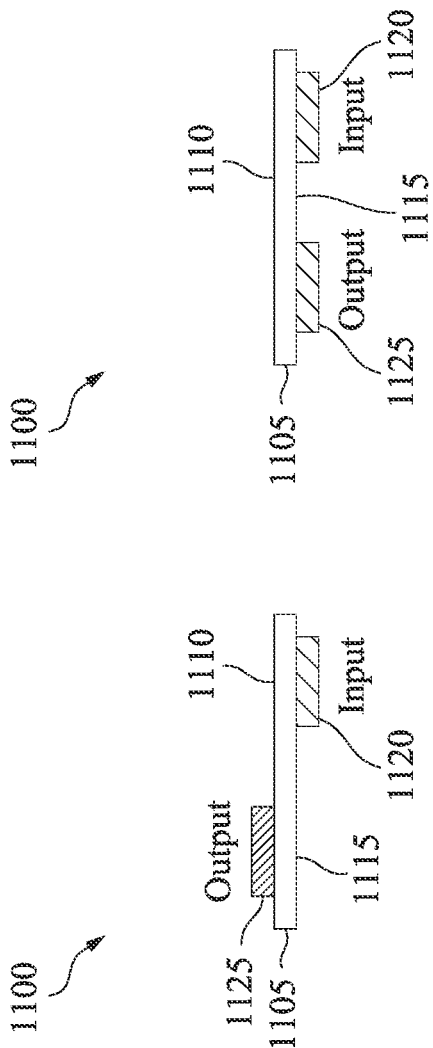
FIGS. 11A, 11B, and 11C are examples showing arrangement of input and output pins on a semiconductor substrate to enable back-side routing, in accordance with some embodiments.
Figure 11B:
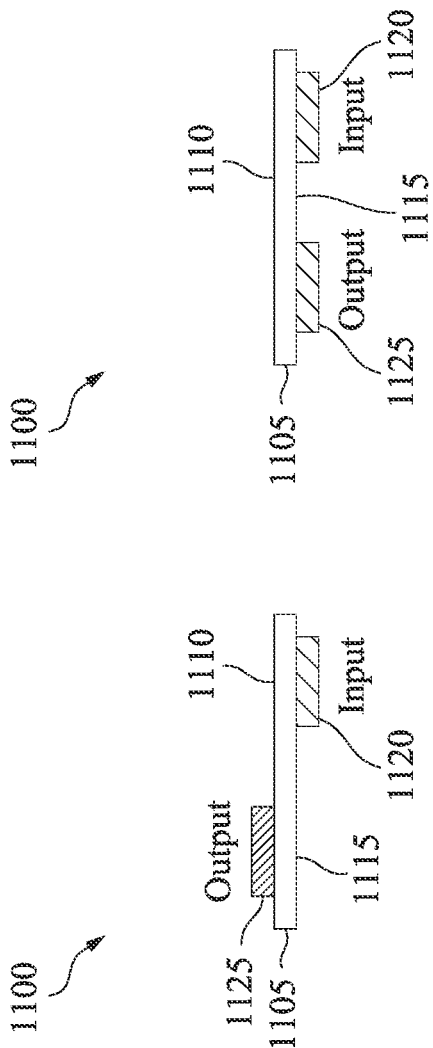
Figure 11C:
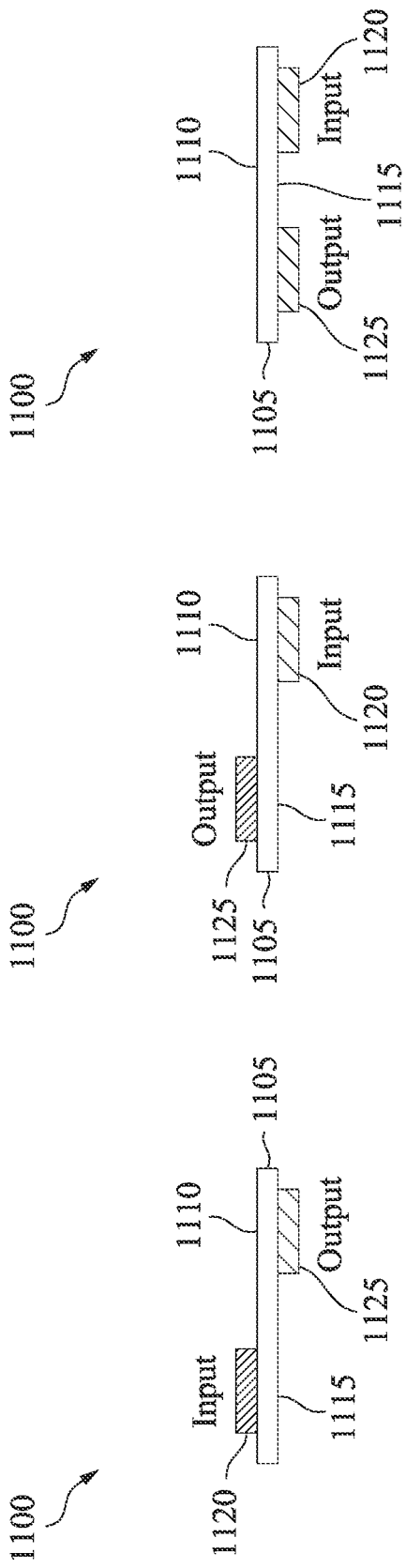

Referring now to FIGS. 11A-11C, example arrangements of input and output pins on a cell 1100 for back side routing of a substrate 1105 are shown, in accordance with some embodiments of the present disclosure. The substrate 1105 includes a first side 1110, which is analogous to the first side 210, and a second side 1115, which is analogous to the second side 215. Thus, the first side 1110 may be considered the front side and the second side 1115 may be considered the back side. Conventionally, all input and output pins of the cell 1100 would be provided on the first side 1110. However, to provide back side routing and to bridge the connections or nets on the second side 1115 with the connections or nets on the first side 1110, alternative arrangements of pins are needed. For example, in some embodiments, to bridge the connections or nets on the second side 1115 with the connections or nets on the first side 1110, as shown in FIG. 11A, input pins 1120 may be provided on the first side 1110 and output pins 1125 may be provided on the second side 1115. Alternatively and as shown in FIG. 11B, in some embodiments, to bridge the connections or nets on the second side 1115 with the connections or nets on the first side 1110, the input pins 1120 may be provided on the second side and the output pins 1125 may be provided on the first side.

In some embodiments, the nets on the second side 1115 may be connected to other nets on the second side. To facilitate such a connection, in some embodiments, the cell 1100 may include the input pins 1120 and the output pins 1125 that are both located on the second side 1115 of the cell. In some embodiments, the cell 1100 that includes the input pins 1120 and the output pins 1125 both on the second side 1115 may be similar to the cell that has the input and output pins on the first side 1110, but may be modified to connect to the second side instead of the first side such that the input and output pins are extending outwardly from the second side to facilitate a connection. In some embodiments, the cell 1100 may be a buffer cell or an inverter cell that is described in the figures above. In other embodiments, the cell 1100 may be another type of cell that may be used to bridge connections or nets on the second side 1115 with the connections or nets on the first side 1110.

Turning to FIGS. 12A-12D, an example layout of a buffer cell 1200 having input pins on one side of a substrate and output pins on another side of the substrate is shown, in accordance with some embodiments of the present disclosure. For example, the buffer cell 1200 is shown with an input pin 1205 that is on a second side 1210 of a substrate 1215 and an output pin 1220 that is on a first side 1225 of the substrate. The first side 1225 is analogous to the first side 210 and is considered to be the front side of the substrate 1215, while the second side 1210 is analogous to the second side 215 and is considered to be the back side of the substrate. The substrate 1215 is shown transparent only for illustration purposes. In other embodiments, the substrate 1215 need not be transparent.

Further, in some embodiments, the input pin 1205 (e.g., the input terminal) may be provided using a back-side interconnect metal layer 0 (e.g., back side BM0 layer) and the output pin 1220 (e.g., the output terminal) may be provided using a front side interconnect metal layer 0 (e.g., front side M0 layer). In other embodiments, the input pin 1205 and/or the output pin 1220 may be provided using other back side interconnect metal and front side interconnect metal layers, respectively. Although the buffer 1200 has been shown as having the input pin 1205 on the second side 1210 and the output pin 1220 on the first side 1225, in other embodiments, the buffer may be provided similarly to have the input pin on the first side and the output pin on the second side. With the input 1205 being on one side (e.g., the second side 1210) and the output pin 1220 being on the other side (e.g., the first side 1225) of the substrate 1215, the buffer 1200 may be used as a bridging mechanism to route signals between the first side and the second side (e.g., from the input to the output).

Figure 12A:
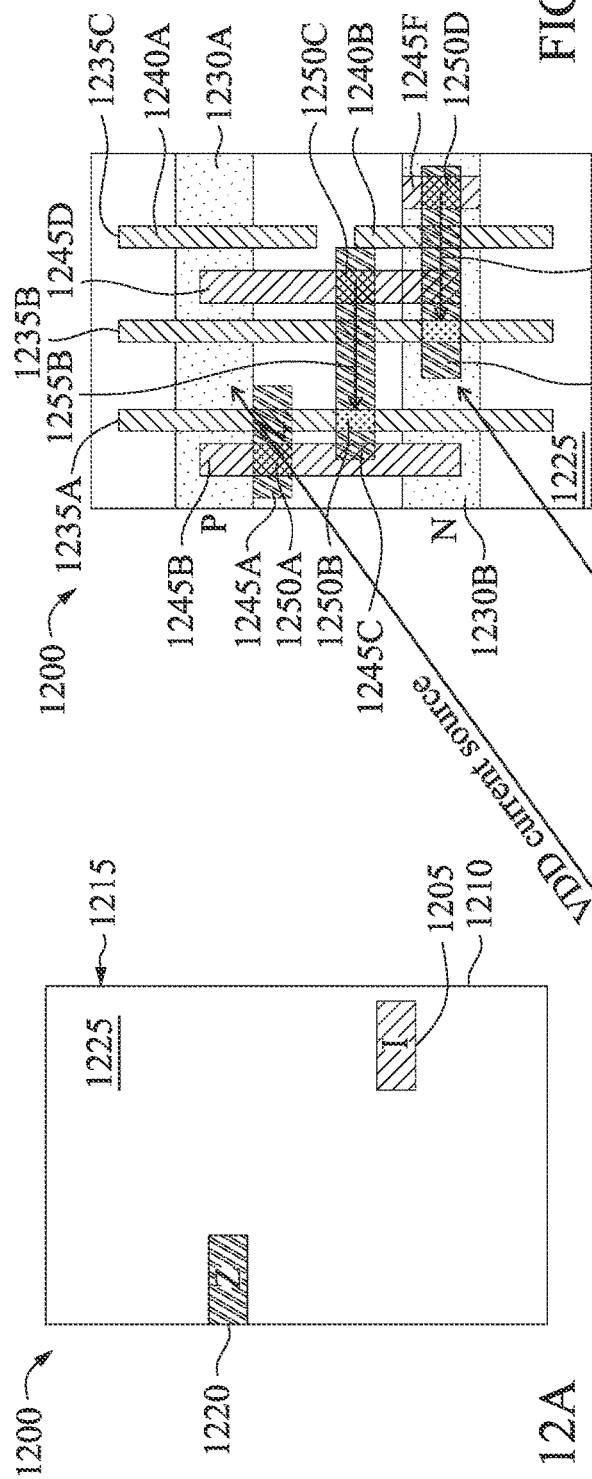
FIG. 12A is an example layout diagram of a buffer for facilitating back-side routing, in accordance with some embodiments.
Figure 12B:
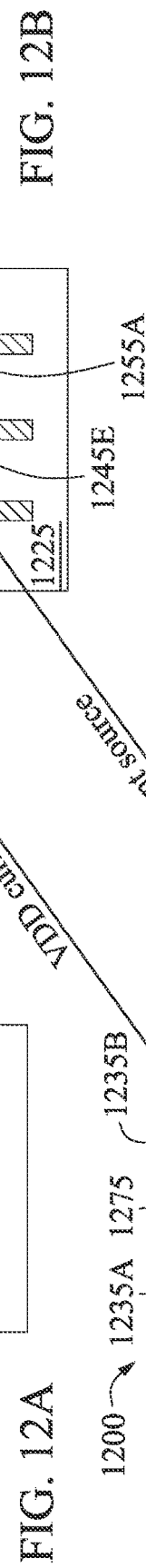
FIGS. 12B and 12C are respective front and back side layout views of the buffer of FIG. 12A, in accordance with some embodiments.
Figure 12C:
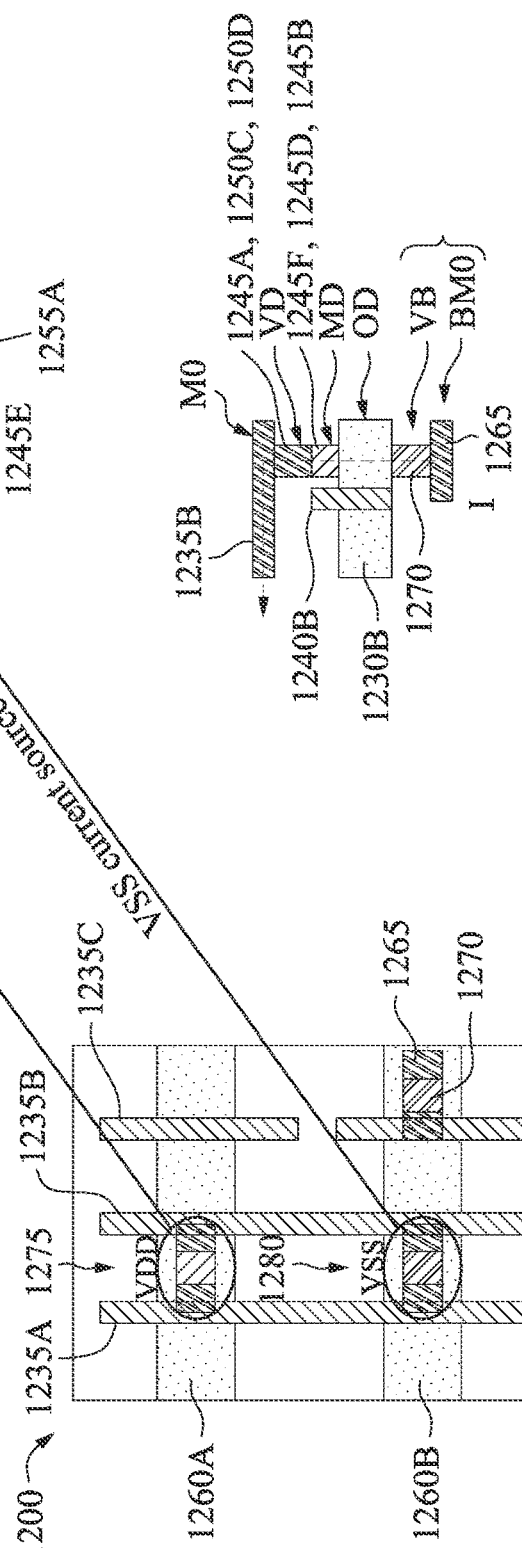
Figure 12D:
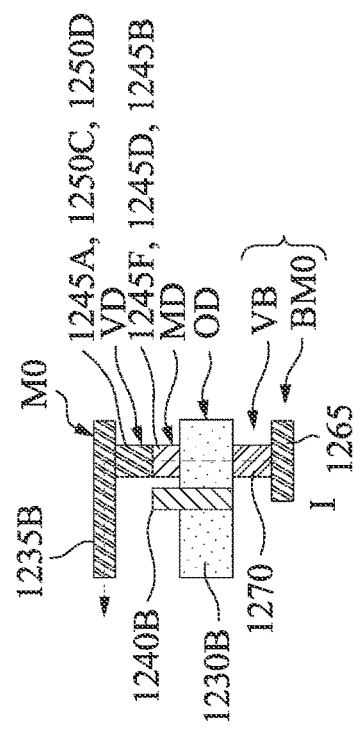
FIG. 12D is an example cross-sectional view of the buffer of FIG. 12A, in accordance with some embodiments.

FIG. 12B shows a top view of an example layout of the buffer 1200 on the first side 1225, FIG. 12C shows a top view of an example layout of the buffer on the second side 1210, and FIG. 12D shows an example cross-sectional layout of the buffer. The layout of the buffer 1200 on the first side 1225 may include a first active region 1230A and a second active region 1230B to form the source and drain terminals of transistors in the buffer 1200. The first active region 1230A and the second active region 1230B may each be a fin-shaped region of one or more three-dimensional field-effect-transistors (e.g., FinFETs, gate-all-around (GAA) transistors), or an oxide-definition (OD) region of one or more planar metal-oxide-semiconductor field-effect-transistors (MOSFETs), such that the active region may serve as a source feature or drain feature of the respective transistor(s). The first active region 1230A and the second active region 1230B may each extend along a cell row direction, such as the X-direction. Further, in some embodiments, the first active region 1230A and the second active region 1230B may be of n-type or p-type.

The layout of the buffer 1200 on the first side 1225 may also include gate structures 1235A, 1235B, and 1235C overlaying the first active region 1230A and the second active region 1230B. The gate structures 1235A-1235C may be formed of one or more conductive materials (e.g., polysilicon(s), metal(s)). The gate structures 1235A-1235C may define the gate terminals of the transistors of the buffer 1200 such that the first active region 1230A and the second active region 1230B on the left and right side of the overlaying gate structures define the source and drain of the transistors of the buffer 1200. The input pin 1205 may be connected to the output pin 1220 via the first active region 1230A, the second active region 1230B, and one or more of the gate structures 1235A-1235C. For example, in some embodiments, the gate structures 1235A and 1235B may extend continuously from the first active region 1230A to the second active region 1230B, while in some embodiments, the gate structure 1235C may be a dummy gate structure, a first portion 1240A of which extends over the first active region and a second portion 1240B of which extends over the second active region such that first portion and the second portion are not connected. In some embodiments, the first portion 1240A may be connected to VDD (e.g., high voltage level) and the second portion 1240B may be connected to VSS (e.g., ground voltage level) to disable the gate structure 1235C.

Further, in some embodiments, the gate structure 1235A may be connected to the output pin 1220 and may be connected to the first active region 1230A through a first conductive layer 1245A (e.g., a Metal 0 layer) connected to the gate structure 1235A. The first conductive layer 1245A may be connected to a second interconnect layer 1245B (e.g., metal over oxide layer) through a via 1250A. A via 1250B may connect the gate structure 1235A to a third interconnect layer 1245C (e.g., a Metal 0 layer), a via 1250C may connect the third interconnect layer to a fourth interconnect layer 1245D (e.g., metal over oxide layer), a via 1250D may connect a fifth interconnect layer 1245E (e.g., a Metal 0 layer) to a sixth interconnect layer 1245F (e.g., a metal over oxide layer), and a via 1250E may connect the fifth interconnect layer to the polysilicon region 1235B. A connection between the input pin 1205 and the output pin 1220 may be established through the sixth interconnect layer to the via 1250D to the via 1250E to the gate structure 1235B, as shown by arrow 1255A. Based on the input signal, the fourth interconnect layer 1245D may have either VDD (e.g., a high voltage level) or VSS (e.g., a low voltage level), which may be passed to the gate of transistor represented by the gate structure 1235A, as shown by arrow 1255B. Based on the VDD or VSS voltage signal to the gate structure 1235A, the second interconnect layer 1245B has VDD or VSS voltage, respectively, as the output on the output pin 1220.

FIG. 12C shows an example layout of the buffer 1200 on the second side 1210. The layout includes a third active region 1260A and a fourth active region 1260B. The third active region 1260A and the fourth active region 1260B may each be a fin-shaped region of one or more three-dimensional field-effect-transistors (e.g., FinFETs, gate-all-around (GAA) transistors), or an oxide-definition (OD) region of one or more planar metal-oxide-semiconductor field-effect-transistors (MOSFETs), such that the active region may serve as a source feature or drain feature of the respective transistor(s). The third active region 1260A and the fourth active region 1260B may each extend along a cell row direction, such as the X-direction. Further, in some embodiments, the third active region 1260A and the fourth active region 1260B may be of n-type or p-type. In some embodiments, the third active region 1260A may correspond (e.g., align) with the first active region 1230A on the first side 1225 and the fourth active region 1260B may correspond (e.g., align) with the second active region 1230B on the first side.

The layout of the buffer 1200 on the second side 1210 does not include any gate structure in some embodiments. The gate structure 1235A-1235C are shown in FIG. 12C simply to show the location of those regions on the first side 1225. The input pin 1205 is connected via a back-side interconnect metal layer (e.g., back side Metal 0 layer) 1265 and via 1270 to the second active region 1230B, as shown in the cross-sectional layout of FIG. 12C. Also shown in the layout of FIG. 12C are VDD pins 1275 and VSS pins 1280 representing the power and ground signals on the second side 1210.

Figure 13:
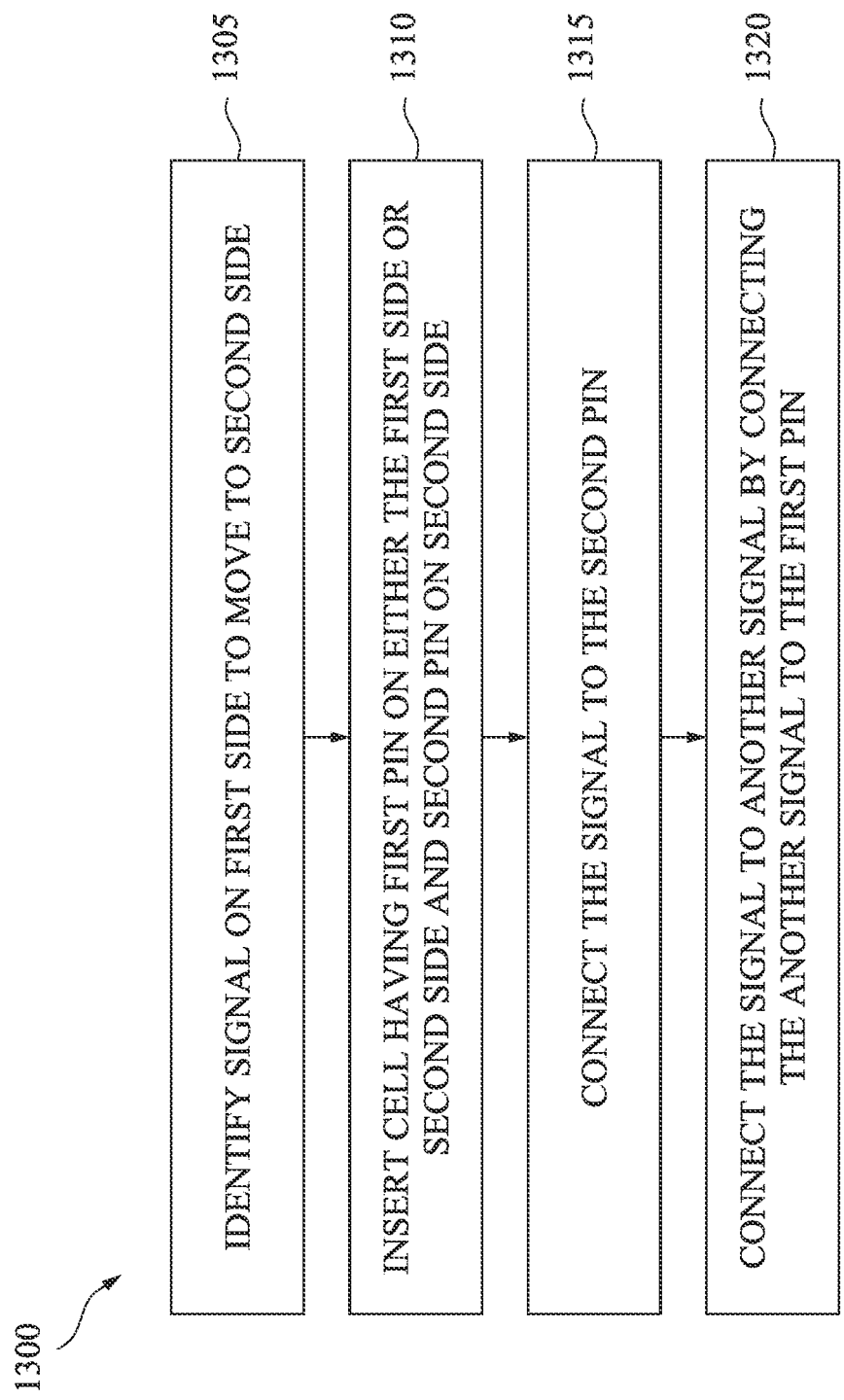
FIG. 13 is an example flowchart outlining operations for performing back side routing, in accordance with some embodiments of the present disclosure.

Turning now to FIG. 13, an example flowchart outlining operations of a process 1300 is shown, in accordance with some embodiments of the present disclosure. The process 1300 may be implemented by the standard layout application 135. The process 1300 may include other or additional operations in other embodiments. At operation 1305, one or more signals that are to be moved from a front side of the substrate to the back side of the substrate are identified. In some embodiments, the one or more signals may be clock tree signals, feedthrough wires, and/or timing critical long nets. In other embodiments, other or additional signals may be identified for moving from the front side to the back side of the substrate. At operation 1310, one or more buffers or inverters are inserted on the substrate if the substrate is not configured for back side connections. For example, if the substrate is not configured with back side connection pins, one or more buffers or inverters having pins on the back side may be inserted. Depending upon the signals that are to be moved to the back side of the substrate and how those signals are to be connected to other signals, the number of buffers/inverters may vary. Further, each buffer/inverter may need to have pins on the front side or the back side of the substrate depending upon the configuration.

For example, to connect a clock trunk signal on the back side of the substrate to a clock leaf signal on the front side of the substrate, a buffer that has input pins on the back side and output pins on the front side of the substrate may be inserted. To connect a clock trunk signal to another clock trunk signal, a buffer having input and output pins on the back side of the substrate may be inserted. Similarly, for feedthrough signals, a buffer having input and output pins on the back side may be inserted. For timing critical nets, a pair of buffers, each having input pins on one side and output pins on the other side may be inserted, as described above.

Upon inserting the one or more buffers/inverters, at operations 1315 and 1320, the routing resources of the signal (e.g., first signal) identified at the operation 1305 may be connected to a pin of the buffer that is on the back side and another signal to which the first signal is connected to may connect to the other pin of that buffer. In some embodiments, the first signal may be provided to alternate with power and ground signals to provide natural shielding.

Thus, the present disclosure provides a mechanism to move or route certain signals from the front side of a substrate to the back side of the substrate to leverage power and ground signals on the back side of the substrate for shielding, as well as to lower resistance and to free resources on the front side of the substrate for other purposes, thereby reducing chip area and increasing speed/performance. In some embodiments, signals such as clock tree signals, feedthrough wires, and/or timing critical long nets may be routed on the back side of the substrate. In other embodiments, other or additional signals may be routed on the back side of the substrate. In some embodiments, the substrate may already be configured for back side connections. For example, in some embodiments, the back side of the substrate may include pins on the back side to enable signal connection and feeding the signals from the back side to the front side of the substrate. In other embodiments, if back side pin connections are not provided on the back side of the substrate, a buffer or inverter having input pins on one side (e.g., front side or back side) and output pins on the other side (e.g., back side or front side) may be used to bridge signals from the back side to the front side, and vice-versa.

In accordance with some aspects of the present disclosure, a system is disclosed. The system includes a substrate having a first side and a second side. An active device of an integrated circuit formed on the substrate is on the first side and the second side is opposite the first side. The system also includes a cell on the substrate having a first pin on either the first side or the second side, and a second pin on the second side, a first signal routing connected to the first pin, and a second signal routing connected to the second pin.

In accordance with some other aspects of the present disclosure, a method is disclosed. The method includes identifying a signal routing on a first side of a substrate to move to a second side of the substrate. An active device of the integrated circuit formed on the substrate is on the first side and the second side is opposite the first side. The method also includes inserting a cell on the substrate having a first pin on either the first side or the second side and a second pin on the second side, connecting the signal routing to the second pin, and connecting the signal routing to another signal routing by connecting the another signal routing to the first pin.

In accordance with yet other aspects of the present disclosure, a device is disclosed. The device includes a substrate having a first side and a second side. An active device formed on the substrate is on the first side and the second side is opposite the first side. The device also includes an output pin on the first side, an input pin on the second side, a first active region on the first side, and a second active region on the first side. To connect the input pin to the output pin, the input pin is connected to the first active region, the output pin is connected to the second active region, and the first active region is connected to the second active region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system comprising:
   a substrate having a first side and a second side, wherein an active device of an integrated circuit formed on the substrate is on the first side and the second side is opposite the first side;
   a cell on the substrate having a first pin on the first side, and a second pin on the second side;
   a first signal routing connected to the first pin to route a clock leaf signal; and
   a second signal routing connected to the second pin to route a clock trunk signal.

2. The system of claim 1, wherein the cell is a buffer or inverter.

3. The system of claim 1, wherein the first signal routing is connected to the first pin through a first via.

4. The system of claim 1, wherein the second signal routing is connected to the second pin through a second via.

5. A system comprising,
   a substrate having a first side and a second side, wherein an active device of an integrated circuit formed on the substrate is on the first side and the second side is opposite the first side;
   a cell on the substrate having a first pin on the second side and a second pin on the second side;
   a first signal routing connected to the first pin; and
   a second signal routing connected to the second pin,
   wherein the first signal routing is configured to route a first clock trunk signal and the second signal routing is configured to route a second clock trunk signal.

6. The system of claim 5, wherein the first signal routing is connected to the first pin through a first via and the second signal routing is connected to the second pin through a second via.

7. The system of claim 5, wherein the first clock trunk signal is separated from the second clock trunk signal by a power and ground signal track on the second side.

8. The A system comprising,
   a substrate having a first side and a second side, wherein an active device of an integrated circuit formed on the substrate is on the first side and the second side is opposite the first side;
   a cell on the substrate having a first pin on the second side and a second pin on the second side;
   a first signal routing connected to the first pin; and
   a second signal routing connected to the second pin,
   wherein the first signal routing is configured to route a first feedthrough wire portion of a feedthrough wire and the second signal routing is configured to route a second feedthrough wire portion of the feedthrough wire.

9. The system of claim 8, wherein the feedthrough wire extends in a vertical direction, and wherein the first pin and the second pin are vertically aligned.

10. The system of claim 8, wherein the feedthrough wire extends in a horizontal direction, and wherein the first pin and the second pin are horizontally aligned.

11. The system of claim 8, wherein the feedthrough wire is separated from a neighboring feedthrough wire by a power and ground signal track on the second side.

12. A system comprising,
   a substrate having a first side and a second side, wherein an active device of an integrated circuit formed on the substrate is on the first side and the second side is opposite the first side;
   a first cell on the substrate having a first pin on the first side and a second pin on the second side;
   a second cell on the substrate having a third pin on the first side and a fourth pin on the second side;
   a first signal routing connected to the first pin;
   a second signal routing connected to the second pin;
   a third signal routing on the first side connected to the third pin, wherein the first signal routing is connected to the third signal routing via the second signal routing such that one end of the second signal routing is connected to the second pin and another end of the second signal routing is connected to the fourth pin; and wherein the second signal routing is a timing critical net.

13. The system of claim 12, wherein each of the first cell and the second cell is a buffer or inverter.

14. A method for generating a layout of an integrated circuit comprising:

identifying a signal routing on a first side of a substrate to move to a second side of the substrate, wherein an active device of the integrated circuit formed on the substrate is on the first side and the second side is opposite the first side;

inserting a cell on the substrate having a first pin on either the first side or the second side and a second pin on the second side;

connecting the signal routing to the second pin; and connecting the signal routing to another signal routing by connecting the another signal routing to the first pin.

15. The method of claim 14, further comprising connecting the signal routing to the second pin through a first via.

16. The method of claim 15, further comprising connecting the another signal routing to the first pin through a second via.

17. The method of claim 14, wherein the cell is a buffer or inverter.

18. The method of claim 14, wherein the signal routing comprises a clock tree signal.

19. The method of claim 14, wherein the signal routing comprises a feedthrough wire.

20. The method of claim 14, wherein the signal routing comprises a timing critical net.

* * * * *